United States Patent
Huang et al.

(10) Patent No.: US 10,333,355 B2
(45) Date of Patent: Jun. 25, 2019

(54) WIRELESS CHARGING MAGNETIC PARAMETER DETERMINATION

(71) Applicant: WiTricity Corporation, Watertown, MA (US)

(72) Inventors: Chang-Yu Huang, Auckland (NZ); Mikel Bipin Budhia, Auckland (NZ); Michael Le Gallais Kissin, Auckland (NZ); Jonathan Beaver, Auckland (NZ)

(73) Assignee: WiTricity Corporation, Watertown, MA (US)

( * ) Notice: Subject to any disclaimer, the term of this patent is extended or adjusted under 35 U.S.C. 154(b) by 53 days.

(21) Appl. No.: 15/656,927

(22) Filed: Jul. 21, 2017

(65) Prior Publication Data

US 2019/0027965 A1    Jan. 24, 2019

(51) Int. Cl.

| | |
|---|---|
| *H02J 50/12* | (2016.01) |
| *G01R 27/26* | (2006.01) |
| *G01R 33/028* | (2006.01) |
| *G01R 33/12* | (2006.01) |
| *B60L 53/12* | (2019.01) |

(Continued)

(52) U.S. Cl.
CPC .............. *H02J 50/12* (2016.02); *B60L 53/12* (2019.02); *G01R 27/2611* (2013.01); *G01R 33/0283* (2013.01); *G01R 33/12* (2013.01); *G01R 33/00* (2013.01); *H02J 50/80* (2016.02)

(58) Field of Classification Search
CPC ....... H02J 50/12; H02J 50/80; G01R 27/2611; G01R 33/0283; G01R 33/12; G01R 33/00; B60L 53/12
See application file for complete search history.

(56) References Cited

U.S. PATENT DOCUMENTS

| | | |
|---|---|---|
| 2011/0304216 A1 | 12/2011 | Baarman |
| 2015/0108849 A1 | 4/2015 | Robertson |

(Continued)

FOREIGN PATENT DOCUMENTS

| | | |
|---|---|---|
| EP | 2905871 A1 | 8/2015 |
| JP | 2011045161 A | 3/2011 |
| WO | 2015128901 A1 | 9/2015 |

OTHER PUBLICATIONS

International Search Report and Written Opinion—PCT/US2018/039458—ISA/EPO—dated Aug. 28, 2018.

*Primary Examiner* — Robert L DeBeradinis
(74) *Attorney, Agent, or Firm* — Hunter Clark PLLC

(57) ABSTRACT

A method of determining a value of a magnetic characteristic of a wireless-power receiver system includes: obtaining a first frequency indication of a first resonant frequency of a power reception circuit of the wireless-power receiver system corresponding to a power transmit circuit and the power reception circuit being in a first state having a first combined circuit configuration; obtaining a second frequency indication of a second resonant frequency of the power reception circuit corresponding to the combination of the power transmit circuit and the power reception circuit being in a second state having a second combined circuit configuration, the first combined circuit configuration differing from the second combined circuit configuration by at least one of component content or a value of at least one component; and using the first frequency indication and the second frequency indication to determine the value of the magnetic characteristic of the wireless-power receiver system.

30 Claims, 9 Drawing Sheets

(51) Int. Cl.
    *G01R 33/00*    (2006.01)
    *H02J 50/80*    (2016.01)

(56) References Cited

U.S. PATENT DOCUMENTS

2015/0180286 A1    6/2015    Asanuma et al.
2015/0285845 A1    10/2015   Ichikawa et al.
2017/0179772 A1    6/2017    Asanuma et al.

$$\omega_1 L_{2eqv\_a} = \omega_1 l_2 + \cfrac{N^2}{\cfrac{1}{\omega_1 M} + \cfrac{1}{\omega_1 l_1 + \cfrac{1}{\cfrac{1}{\omega_1 L_B} - \omega_1 C_1}}}$$

$$\omega_2 L_{2eqv\_b} = \omega_2 l_2 + \frac{N^2}{\frac{1}{\omega_2 M} + \frac{1}{\omega_2 l_1 - \frac{1}{\omega_2 C_1}}}$$

$$\frac{l_2}{M} = \frac{Nl_1 - N^2 l_2}{l_2}$$

WIRELESS CHARGING MAGNETIC PARAMETER DETERMINATION

TECHNICAL FIELD

The disclosure relates generally to wireless power delivery to electronic devices, and in particular to determining a magnetic parameter of a wireless charging system.

BACKGROUND

Remote systems, such as vehicles, have been introduced that include locomotion power derived from electricity received from an energy storage device such as a battery. Such energy storage devices need to be periodically charged. For example, hybrid electric vehicles include onboard chargers that use power from vehicle braking and traditional motors to charge the vehicles. Battery electric vehicles (electric vehicles) are often proposed to be charged through some type of wired alternating current (AC) such as household or commercial AC supply sources. The wired charging connections require cables or other similar connectors that are physically connected to a power supply. Cables and similar connectors may sometimes be inconvenient or cumbersome and have other drawbacks. Wireless charging systems that are capable of transferring power in free space (e.g., via an electromagnetic field) to be used to charge electric vehicles may overcome some of the deficiencies of wired charging solutions.

SUMMARY

The following detailed description and accompanying drawings provide a better understanding of the nature and advantages of the disclosure.

An example of a wireless-power receiver system includes: a power reception circuit coupled to an electrical load and configured to receive power wirelessly from a power transmit circuit to power the electrical load; a memory; and a processor, communicatively coupled to the memory and to the power reception circuit, configured to: obtain a first frequency indication of a first resonant frequency of the power reception circuit corresponding to a combination of the power transmit circuit and the power reception circuit being in a first state having a first combined circuit configuration; obtain a second frequency indication of a second resonant frequency of the power reception circuit corresponding to the combination of the power transmit circuit and the power reception circuit being in a second state having a second combined circuit configuration, the first combined circuit configuration differing from the second combined circuit configuration by at least one of component content or a value of at least one component; and determine a value of a magnetic characteristic of the wireless-power receiver system using the first frequency indication and the second frequency indication.

An example of a method of determining a value of a magnetic characteristic of a wireless-power receiver system includes: obtaining a first frequency indication of a first resonant frequency, the first resonant frequency being of a power reception circuit of the wireless-power receiver system and corresponding to a combination of a power transmit circuit and the power reception circuit being in a first state having a first combined circuit configuration; obtaining a second frequency indication of a second resonant frequency of the power reception circuit corresponding to the combination of the power transmit circuit and the power reception circuit being in a second state having a second combined circuit configuration, the first combined circuit configuration differing from the second combined circuit configuration by at least one of component content or a value of at least one component; and using the first frequency indication and the second frequency indication to determine the value of the magnetic characteristic of the wireless-power receiver system.

Another example of a wireless-power receiver system includes: an electrical load; power reception means for receiving power wirelessly from a power transmit circuit and for providing power to the electrical load; first determining means, communicatively coupled to the power reception means, for determining: a first frequency indication of a first resonant frequency of the power reception means corresponding to a combination of the power transmit circuit and the power reception means being in a first state having a first combined circuit configuration; and a second frequency indication of a second resonant frequency of the power reception means corresponding to the combination of the power transmit circuit and the power reception means being in a second state having a second combined circuit configuration, the first combined circuit configuration differing from the second combined circuit configuration by at least one of component content or a value of at least one component; and second determining means, communicatively coupled to the first determining means, for determining a value of a magnetic characteristic of the wireless-power receiver system using the first frequency indication and the second frequency indication.

An example of a wireless-power transmitter system includes: a power transmit circuit configured to transmit power wirelessly to a wireless-power receiver system; a memory; and a processor, communicatively coupled to the memory and to the power transmit circuit, configured to: obtain a first frequency indication of a first resonant frequency of a power reception circuit of the wireless-power receiver system, the first resonant frequency corresponding to a combination of the power transmit circuit and the power reception circuit being in a first state having a first combined circuit configuration; obtain a second frequency indication of a second resonant frequency of the power reception circuit corresponding to the combination of the power transmit circuit and the power reception circuit being in a second state having a second combined circuit configuration, the first combined circuit configuration differing from the second combined circuit configuration by at least one of component content or a value of at least one component; and determine a value of a magnetic characteristic of the wireless-power receiver system using the first frequency indication and the second frequency indication.

An example of a non-transitory, processor-readable storage medium stores processor-readable instructions configured to cause a processor to: obtain a first frequency indication of a first resonant frequency, the first resonant frequency being of a power reception circuit of a wireless-power receiver system and corresponding to a combination of a power transmit circuit and the power reception circuit being in a first state having a first combined circuit configuration; obtain a second frequency indication of a second resonant frequency of the power reception circuit corresponding to the combination of the power transmit circuit and the power reception circuit being in a second state having a second combined circuit configuration, the first combined circuit configuration differing from the second combined circuit configuration by at least one of component content or a value of at least one component; and use the first frequency indication and the second frequency indication to determine the value of a magnetic characteristic of the wireless-power receiver system.

Implementations of such a storage medium may include one or more of the following features. The storage medium further includes instructions configured to cause the processor to cause the wireless-power receiver system to emit an evaluation signal, where the instructions configured to cause the processor to obtain the first frequency indication and the second frequency indication are configured to cause the processor to determine a frequency of the evaluation signal. The storage medium further includes instructions configured to cause the processor to cause the power transmit circuit to change a content of a component set that receives energy from the evaluation signal between the first state and the second state. The instructions configured to cause the processor to cause the power transmit circuit to change the content of the component set include instructions configured to cause the processor to cause an inverter bridge to change between being open circuited and shorted between the first state and the second state. The instructions configured to cause the processor to obtain the first frequency indication and the second frequency indication are configured to cause the processor to monitor a self-resonant structure of the power reception circuit that provides the evaluation signal. The instructions configured to cause the processor to cause the wireless-power receiver system to emit the evaluation signal include instructions configured to cause the processor to cause a signal generator to produce the evaluation signal with a plurality of different frequencies.

Also or alternatively, implementations of such a storage medium may include one or more of the following features. The instructions configured to cause the processor to determine the value of the magnetic characteristic of the wireless-power receiver system include instructions configured to cause the processor to: determine a first leakage inductance of a transmit coil of the power transmit circuit; determine a second leakage inductance of a receive coil of the power reception circuit; and determine a mutual inductance between the transmit coil and the receive coil. The storage medium further includes instructions configured to cause the processor to: obtain a first current indication of current in the transmit coil; obtain a second current indication of current in the receive coil; obtain a first impedance indication of an impedance of the power reception circuit with the combination of the power transmit circuit and the power reception circuit in the first state; and obtain a second impedance indication of the impedance of the power reception circuit with the combination of the power transmit circuit and the power reception circuit in the second state; where the instructions configured to cause the processor to determine the first leakage inductance, the second leakage inductance, and the mutual inductance are configured to cause the processor to use the first frequency indication, the second frequency indication, the first impedance indication, the second impedance indication, the first current indication, and the second current indication to determine the first leakage inductance, the second leakage inductance, and the mutual inductance.

Figure 1:
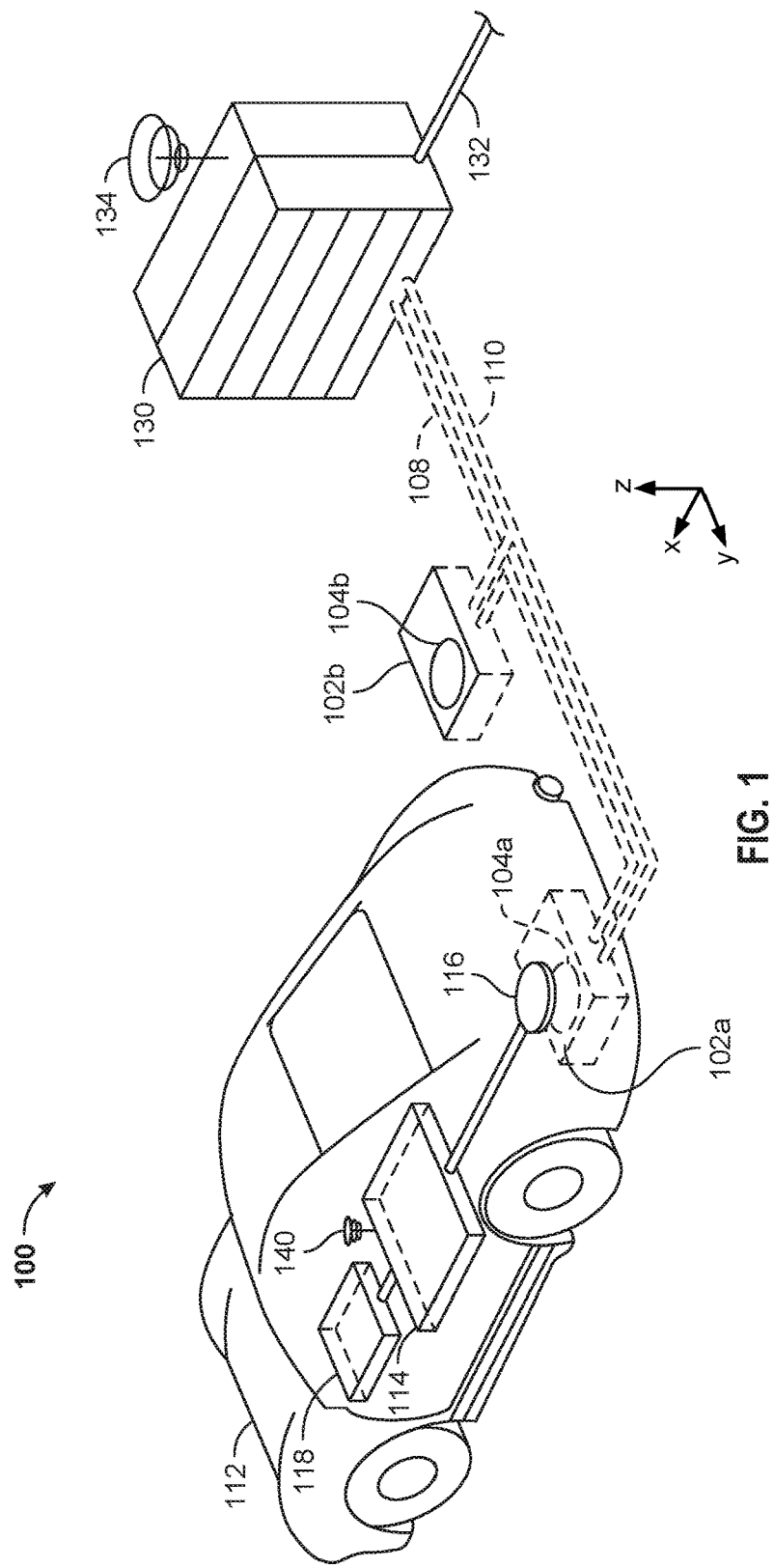
FIG. 1 is a perspective view of an example wireless electric vehicle charging system.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is a description of example implementations and does not represent the only implementations in which the invention may be practiced. The term "exemplary" used throughout this description means "serving as an example, instance, or illustration," and does not require that the item(s) described as exemplary is(are) preferred or advantageous over other implementations. The detailed description includes specific details for the purpose of providing a thorough understanding of the implementations. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into an electro-magnetic field (e.g., a magnetic field) may be received, captured by, or coupled by a "receiving element" to achieve power transfer.

Techniques are discussed herein for determining various characteristics of components of wireless electric vehicle charging (WEVC) systems. For example, techniques are discussed for determining a leakage inductance of a primary side power-coupling element, leakage inductance of a secondary side power-coupling element, and a mutual inductance of the primary side and secondary side of a WEVC system may be determined. The primary side is configured to provide charging power to the secondary side. With the primary side and secondary side in a fixed physical relationship to each other, a resonant frequency of the one of the sides, e.g., the secondary side, is determined. With the physical relationship the same, a component content of at least one of the sides, e.g., in circuitry that receives energy coupled from the other side, is changed and the resonant frequency is re-determined. Further, currents in the power-coupling elements are determined. The two resonant frequencies and the currents are used to determine the leakage inductance of each of the power-coupling elements and the mutual inductance. Other examples are within the scope of the disclosure, some of which are discussed below.

Items and/or techniques described herein may provide one or more of the following capabilities, as well as other capabilities not mentioned. Characteristics of a wireless power receiving system may be determined, and may be determined using power transfer circuitry, e.g., without dedicated circuitry for determining the characteristics. Which of multiple frequencies to use to charge the wireless power receiving system more efficiently may be determined. Provision of high amounts of power by a vehicle charging pad without a vehicle being sufficiently aligned with the vehicle charging pad may be guarded against. Provision of high amounts of power from a vehicle charging pad to a foreign object, such as a living object, may be guarded against. Other capabilities may be provided and not every implementation according to the disclosure must provide any, let alone all, of the capabilities discussed.

An electric vehicle is used herein to describe a remote system, an example of which is a vehicle that includes, as part of its locomotion capabilities, electrical power derived from a chargeable energy storage device (e.g., one or more rechargeable electrochemical cells or other type of battery). As non-limiting examples, some electric vehicles may be hybrid electric vehicles that include, besides electric motors, a traditional combustion engine for direct locomotion or to charge the vehicle's battery. Other electric vehicles may draw all locomotion ability from electrical power. An electric vehicle is not limited to an automobile and may include motorcycles, carts, scooters, and the like. By way of example and not limitation, a remote system is described herein in the form of an electric vehicle (EV). Furthermore, other remote systems that may be at least partially powered using a chargeable energy storage device are also contemplated (e.g., electronic devices such as personal computing devices and the like) and possible, whether presently known or not.

FIG. 1 is a diagram of a wireless charging system 100 for charging an electric vehicle 112, in accordance with some implementations. The wireless charging system 100 enables charging of an electric vehicle 112 while the electric vehicle 112 is parked near a base wireless charging system 102a. Spaces for two electric vehicles are illustrated in a parking area to be parked over corresponding base wireless charging systems 102a and 102b. In some implementations, a local power distribution center 130 may be connected to a power backbone 132 and configured to provide an alternating current (AC) or a direct current (DC) supply through a power link 110 to the base wireless charging systems 102a and 102b. The base wireless charging system 102a includes a base power transfer element 104a for wirelessly transferring (e.g., transmitting and/or receiving) power. Likewise, the base wireless charging system 102b includes a base power transfer element 104b for wirelessly transferring power. In some implementations (not shown in FIG. 1), the base power transfer elements 104a or 104b may be stand-alone physical units that are not part of the base wireless charging systems 102a or 102b. The electric vehicle 112 may include a battery unit 118, and an electric vehicle wireless charging system 114 including an electric vehicle power transfer element 116. In some implementations (not shown in FIG. 1), the vehicle power transfer element 116 may be part of the electric vehicle wireless charging system 114. In some implementations, the entity comprising the base power transfer element 104a is referred to as the base pad and the entity comprising the vehicle power transfer element 116 is referred to as the vehicle pad.

The electric vehicle power transfer element 116 may interact with the base power transfer element 104a for example, via a region of a wireless field generated by the base power transfer element 104a. In some implementations, the electric vehicle power transfer element 116 may receive power when the electric vehicle power transfer element 116 is located in an energy field produced by the base power transfer element 104a. The field corresponds to a region where energy output by the base power transfer element 104a may be captured by the electric vehicle power transfer element 116. For example, the energy output by the base power transfer element 104a may be at a level sufficient to charge or power the electric vehicle 112.

In some implementations, the field may correspond to the "near field" of the base power transfer element 104a. The near field may correspond to a region in which there are strong reactive fields resulting from the currents and charges in the base power transfer element 104a that do not radiate power away from the base power transfer element 104a. In some implementations, the near field may correspond to a region that is within about ½π of a wavelength of the base power transfer element 104a (and vice versa for the electric vehicle power transfer element 116).

The local power distribution center 130 may be configured to communicate with external entities (e.g., a power grid management system) via a communication backhaul 134, and with the base wireless charging system 102a via a communication link 108 (e.g., wired or wireless). For example, the communication backhaul 134 may communicate with an antenna 140 of the vehicle 112 regarding the charging infrastructure of the system 100.

In some implementations, the electric vehicle power transfer element 116 may be aligned with the base power transfer element 104a and, therefore, disposed within a near-field region simply by the driver positioning the electric vehicle 112 correctly relative to the base power transfer element 104a. In other implementations, the driver may be given visual, auditory, or tactile feedback, or combinations thereof, to determine when the electric vehicle 112 is properly placed for wireless power transfer. In yet other implementations, the electric vehicle 112 may be positioned by an autopilot system, which may move the electric vehicle 112 back and forth (e.g., in zig-zag movements) until an alignment error has reached a tolerable value. This may be performed automatically and autonomously by the electric vehicle 112 without or with only minor driver intervention provided that the electric vehicle 112 is equipped with appropriate equipment such as a servo steering wheel, ultrasonic sensors, and intelligence to adjust the electric vehicle 112. In still other implementations, the electric vehicle power transfer element 116, the base power transfer element 104a, or a combination thereof, may have functionality for displacing and moving the power transfer elements 116 and 104a relative to each other to more accurately position them and develop more efficient coupling therebetween.

The base wireless charging system 102a may be located in a variety of locations. As non-limiting examples, some suitable locations include a parking area at a home of an owner of the electric vehicle 112, parking areas reserved for electric vehicle wireless charging modeled after conventional petroleum-based filling stations, and parking lots at other locations such as shopping centers and places of employment.

Charging electric vehicles wirelessly may provide numerous benefits. For example, charging may be performed automatically, virtually without driver intervention and manipulations thereby improving convenience to a user. There may be no exposed electrical contacts and no or little mechanical wear out, thereby improving reliability of the wireless charging system 100. Manipulations with cables and connectors may not be needed, and there may be no cables, plugs, or sockets that may be exposed to moisture and water in an outdoor environment, thereby improving safety. There may be no sockets, cables, and plugs visible or accessible, thereby reducing potential vandalism of power charging devices. Further, since the electric vehicle 112 may be used as a distributed storage device to stabilize a power grid, a convenient docking-to-grid solution may help to increase availability of vehicles for Vehicle-to-Grid (V2G) operation. The wireless charging system 100 as described with reference to FIG. 1 may provide aesthetic and non-impedimental advantages. For example, there may be no charge columns and cables that may be impedimental for vehicles and/or pedestrians.

As a further explanation of the vehicle-to-grid capability, the wireless power transmit and receive capabilities may be configured to be reciprocal such that the base wireless charging system 102a transfers power from the power distribution grid to the electric vehicle 112 via the electric vehicle charging system 114 and the electric vehicle charging system 114 transfers power from the electric vehicle 112 via the base wireless charging system 102a to the grid, e.g., in times of energy shortfall. This capability may be useful to stabilize the power distribution grid by allowing electric vehicles to contribute power to the overall distribution system in times of energy shortfall caused by over demand or shortfall in renewable energy production (e.g., wind or solar).

Figure 2:
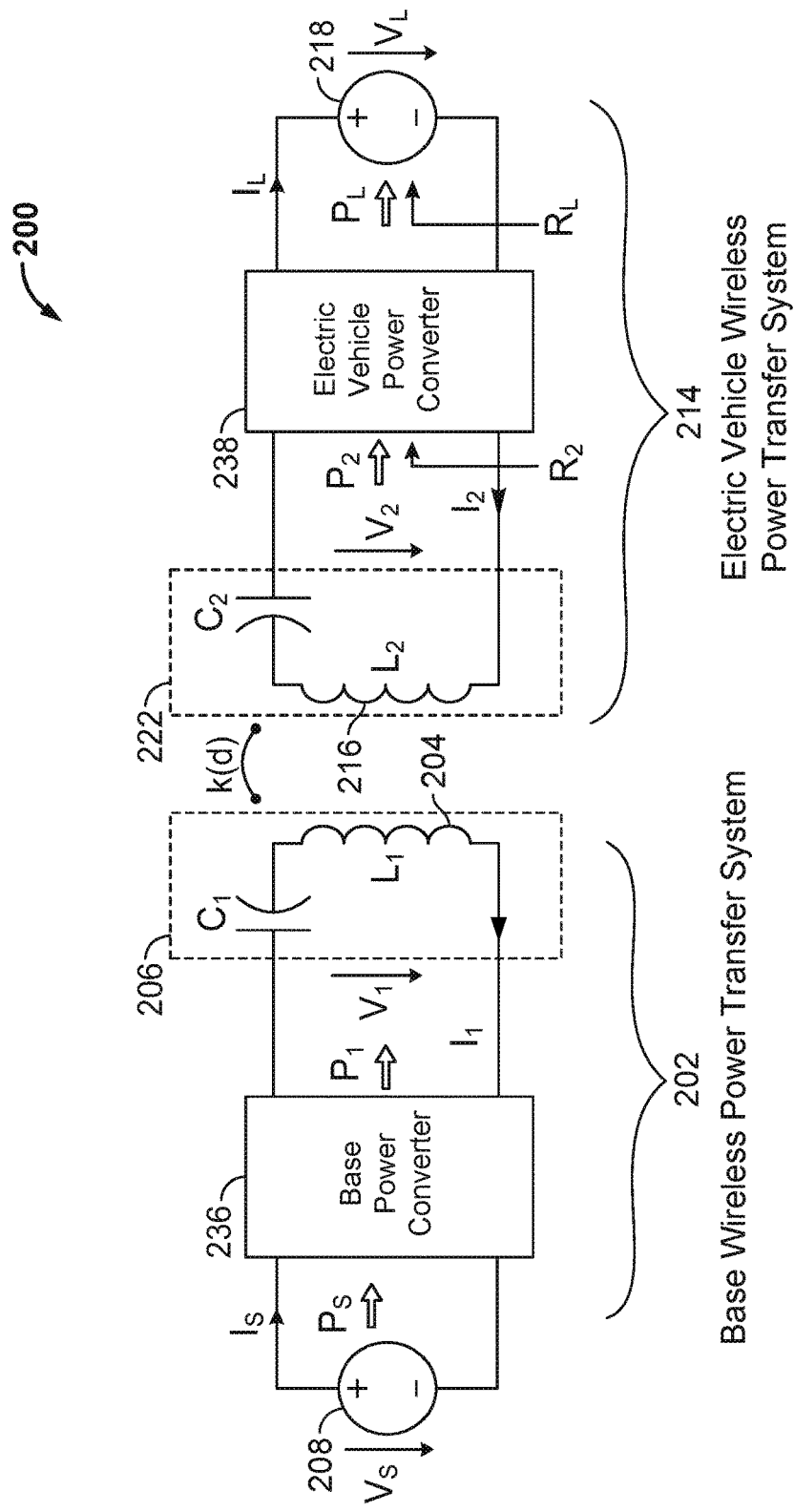
FIG. 2 is a schematic diagram of example components of a primary side and a secondary side of the wireless electric vehicle charging system shown in FIG. 1.

FIG. 2 is a schematic diagram of exemplary components of a wireless power transfer system 200 that may be used for inductive power transfer. As shown in FIG. 2, the wireless power transfer system 200 may be comprised of a base wireless power transfer system 202 and an electric vehicle wireless power transfer system 214. The base wireless power transfer system 202 may include a base transmit circuit 206 including a base power transfer element 204 having an inductance $L_1$. Analogously, as shown in FIG. 2, the electric vehicle wireless power transfer system 214 may include an electric vehicle receive circuit 222 including an electric vehicle power transfer element 216 having an inductance $L_2$.

Implementations of the base transmit circuit 206 and the electric vehicle receive circuit 222 described herein may use capacitively-loaded wire loops (i.e., multi-turn coils) forming a resonant circuit that is capable of efficiently coupling energy from a primary element (transmitter) to a secondary element (receiver) via a magnetic or electromagnetic near field if both primary and secondary elements are tuned to substantially a common resonant frequency (substantially the same resonant frequency). Using resonant circuits or structures for coupling energy may be referred to "magnetic coupled resonance," "electromagnetic coupled resonance," and/or "resonant induction." The operation of the wireless power transfer system 200 will be described based on power transfer from the power distribution grid via the base wireless power transfer system 202 and the electric vehicle wireless power transfer system 214 to an electric vehicle 112, but is not limited thereto. For example, as discussed above, the electric vehicle 112 may transfer power in the reverse direction via the electric vehicle wireless power transfer system 214 and the base wireless power transfer system 202 to the power distribution grid.

With reference to FIG. 2, a power supply 208 (e.g., AC or DC) supplies power $P_S$ to the base wireless power transfer system 202 to transfer energy to the electric vehicle 112 via the electric vehicle power transfer system 214. The base wireless power transfer system 202 includes a base power converter 236. The base power converter 236 may include circuitry such as an AC/DC converter configured to convert power from standard mains AC to DC power at a suitable voltage level, and a DC/AC converter configured to convert DC power to power at an operating frequency suitable for wireless high-power transfer. The power converter 236 supplies power $P_1$ to the base transmit circuit 206 including the base power transfer element 204 to emit a field at a desired frequency. The base transmit circuit 206 may include a capacitor $C_1$ coupled in series to a coil of the base power transfer element 204 as shown in FIG. 2 by example. Alternatively, the base transmit circuit 206 may be formed with the capacitor $C_1$ coupled in parallel to the coil, or may be formed of several reactive elements in any combination of parallel or series topology. The capacitor $C_1$ or the reactive elements may be provided to form a resonant circuit with the base power transfer element 204 near or at the operating frequency defined by the base wireless power transfer system 202. The base power transfer element 204 receives the power $P_1$ and wirelessly transmits power at a level sufficient to charge or power the electric vehicle 112. For example, the power level provided wirelessly by the base power transfer element 204 may be on the order of kilowatts (kW) (e.g., anywhere from 1 kW, or lower, to 110 kW, or higher).

The electric vehicle power transfer element 216 may be positioned within the near field of a primary electromagnetic field transmitted by the base power transfer element 204. In this case, the base power transfer element 204 and the electric vehicle power transfer element 116 may become coupled to one another such that power may be transferred to the electric vehicle receive circuit 222. Element k(d) represents the coupling coefficient resulting at coil separation d. The electric vehicle receive circuit 222 may include a capacitor $C_2$ coupled in series with a coil of the electric vehicle power transfer element 216 as shown in FIG. 2 by example. Alternatively, the electric vehicle receive circuit 222 may be formed with the capacitor $C_2$ coupled in parallel with the coil, or may be formed of several reactive elements in any combination of parallel or series topology. The capacitor $C_2$ or the reactive elements may be provided to form a resonant circuit with the electric vehicle power transfer element 216 near or at the operating frequency as defined by the electric vehicle wireless power transfer system 214. Due to the resonance of the electric vehicle receive circuit 222, the electric vehicle power transfer element 116 may generate a secondary electromagnetic field. The electric vehicle receive circuit 222 receives power $P_2$ and provides the power $P_2$ to an electric vehicle power converter 238 of the electric vehicle wireless power transfer system 214.

As just described, the resonant frequency may be based on the inductance and capacitance. As shown in FIG. 2, inductance may generally be the inductance of the power transfer element (e.g., a coil), whereas, capacitance may be added to the power transfer element to create a resonant structure at a desired resonant frequency.

The electric vehicle power converter 238 may include, among other things, an AC/DC converter configured to convert power at an operating frequency back to DC power at a voltage level matched to the voltage level of an electric vehicle load 218 (e.g. a battery or battery pack). The electric vehicle power converter 238 may provide a converted power $P_L$ to charge the electric vehicle load 218.

The power supply 208, the base power converter 236, and the base power transfer element 204 may be stationary and located at a variety of locations as discussed above. The electric vehicle power converter 238, and the electric vehicle power transfer element 216 may be onboard the electric vehicle 112. In some implementations, both the electric vehicle power converter 238 and the electric vehicle power transfer element 216 are integrated in the electric vehicle load 118 (e.g., in a battery pack). The electric vehicle wireless power transfer system 214 may be configured to provide power wirelessly through the electric vehicle power transfer element 216 and the base power transfer element 204 to the base wireless power transfer system 202 to feed power back to the grid. In some implementations, each of the electric vehicle power transfer element 216 and the base power transfer element 204 may act as a transmit or a receive element based on the mode of operation.

While not shown in FIG. 2, the wireless power transfer system 200 may include a vehicle-side load disconnect unit (LDU) to safely disconnect the electric vehicle load 218 from the wireless power transfer system 200. In some implementations supporting reverse mode operation, an LDU may be provided on the base side (not shown) to safely disconnect the power supply 208 (acting as a load) from the wireless power transfer system 200. For example, in case of an emergency or system failure, the LDU may be triggered to disconnect the load from the wireless power transfer system 200. The LDU may be provided in addition to a battery management system (not shown) for managing charging to a battery, or it may be part of the battery management system.

Further, the electric vehicle wireless power transfer system 214 may include switching circuitry (not shown) for selectively connecting and disconnecting the electric vehicle power transfer element 216 to and from the electric vehicle power converter 238. Disconnecting the electric vehicle power transfer element 216 may suspend charging and may change the "load" as "seen" by the base wireless power transfer system 202 (acting as a power transmitter), which may be used to "cloak" the electric vehicle wireless power transfer system 214 (acting as the receiver) from the base wireless power transfer system 202. The load changes may be detected if the base wireless power transfer system 202 includes a load sensing circuit (not shown). Accordingly, the electric vehicle wireless power transfer system 214 (acting as a power transmitter) may include a mechanism for determining when the base power transfer element 204 connected to the base wireless power transfer system 202 (acting as a power receiver) is present in the near field of the electric vehicle power transfer element 216.

As described above, in operation, assuming energy transfer towards the vehicle 112 (battery 118), input power is provided from the power supply 208 such that the base power transfer element 204 generates an electromagnetic field for providing the energy transfer. The electromagnetic field in turn may induce power into the electric vehicle power transfer element 216 that is sufficient for storage or consumption by the electric vehicle 112. As described above, in some implementations, the base transmit circuit 206 and the electric vehicle receive circuit 222 are configured according to a mutual resonant relationship. In some implementations, the resonant frequencies of the base transmit circuit 206 and the electric vehicle receive circuit 222 are very close or substantially the same. Transmission losses between the input of the base wireless power transfer system 202 and the output of the electric vehicle power transfer system 214 may be reduced when the electric vehicle power transfer element 216 is located in the near field of the base power transfer element 204.

While not shown, the base wireless power transfer system 202 and the electric vehicle wireless power transfer system 214 may both include an oscillator, a driver circuit such as a power amplifier, a filter, and a matching circuit for efficient power transfer via the power transfer elements. The oscillator may be configured to generate a desired operating frequency, which may be adjusted in response to an adjustment signal. The oscillator signal may be amplified by a power amplifier with an amplification amount responsive to control signals. The filter and matching circuit may be included to filter out harmonics or other unwanted frequencies and match the impedance as "seen" at the base power transfer element 204 to the base power converter 236. In some implementations, the base power converter 236 may include solid state switching circuitry to generate a suitable power output as needed to charge an electric vehicle battery (e.g., the battery 118). Analogously, filter and matching circuits may be used to match the impedance as "seen" at the electric vehicle power transfer element 216 to the electric vehicle power converter 238. In some implementations, the electric vehicle power converter 238 may include a rectifier and switching circuitry to generate a suitable DC power output to charge the battery.

The electric vehicle power transfer element 216 and the base power transfer element 204 as described throughout the disclosed implementations may be referred to or configured as "loop" antennas, and more specifically, multi-turn loop antennas. The elements 204 and 216 may also be referred to herein or be configured as "magnetic" antennas. The term "power transfer element" refers to a component that may wirelessly output energy or wirelessly receive energy for coupling to another "power transfer element." The power transfer element may also be referred to as an "antenna" or a "coupler" of a type that is configured to wirelessly output or receive power. As used herein, the power transfer elements 204 and 216 are examples of "power transfer elements" of a type that are configured to wirelessly output, wirelessly receive, and/or wirelessly relay power. Loop (e.g., multi-turn loop) antennas may be configured to include an air core or a physical core such as a ferrite core. An air-core loop antenna may allow the placement of other components within the core area. Physical core antennas including ferromagnetic or ferrimagnetic materials may allow development of a stronger electromagnetic field and improved coupling.

Each of the base power transfer element 204 and the electric vehicle power transfer element 216 may be a "circular"-type coil (using a "circular" coil), a "Double D"-type coil (using a double coil arrangement), a "Solenoid"-type coil (using a solenoid coil wound around a core), a "Bipolar"-type coil (using a double coil arrangement with virtually zero coupling between the coils) or any other type of coil structure based on a single or multi-coil arrangement. In some implementations of the wireless power transfer system 200, different power transfer element types may be used for the base power transfer element 204 and the electric vehicle power transfer element 216.

Figure 3:
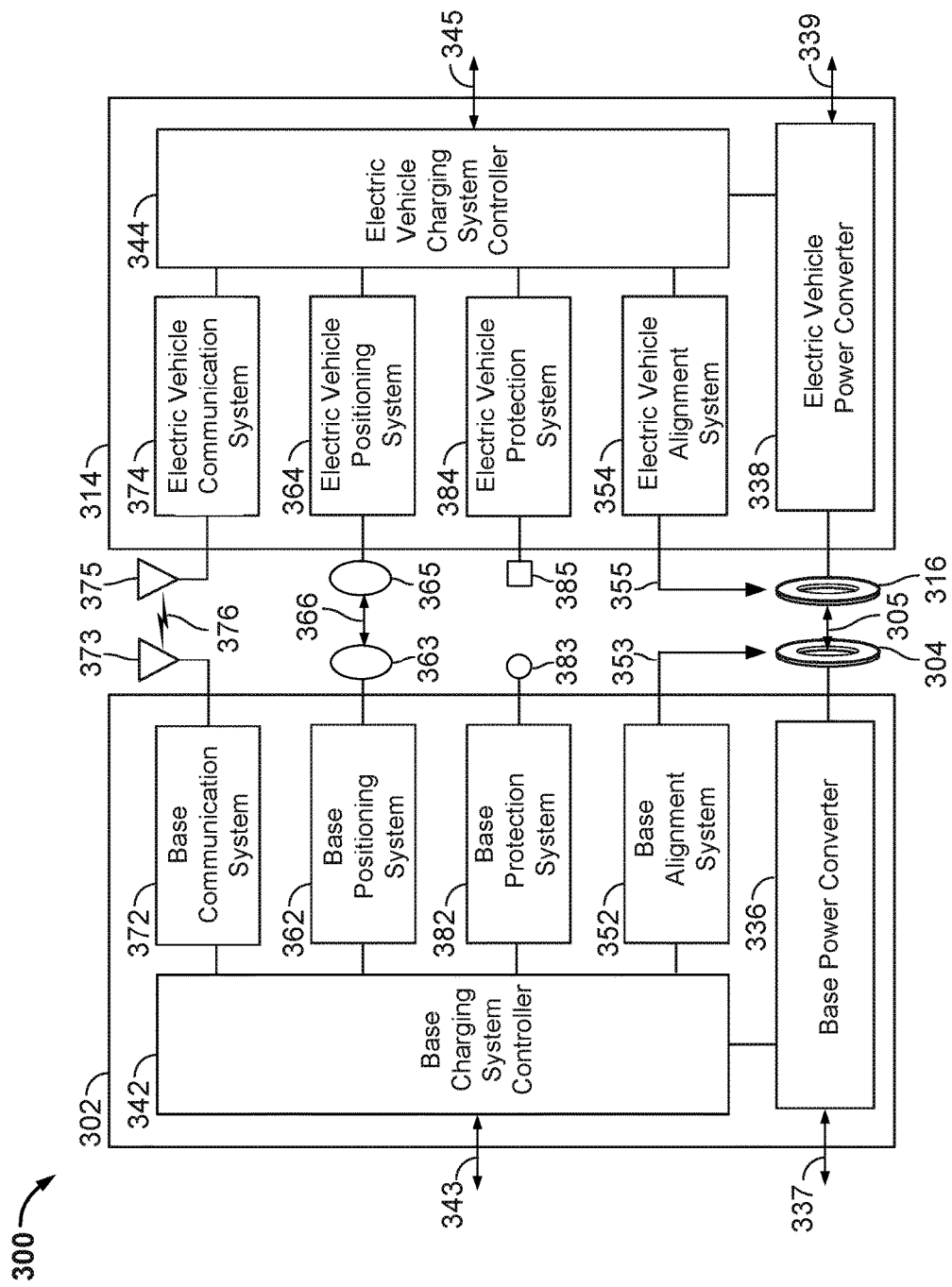
FIG. 3 is a functional block diagram of the primary side and the secondary side of the wireless electric vehicle charging system shown in FIG. 1.

FIG. 3 is another block diagram showing further exemplary components of a wireless charging system 300, e.g., of the wireless charging system 100 of FIG. 1, and/or of which the wireless power transfer system 200 of FIG. 2 may be part. The wireless charging system 300 may be split into a base charging system 302 and an electric vehicle charging system 314. One or more additional components may be included and/or one or more described components may not be included in the base charging system 302 and/or the electric vehicle charging system 314. The base charging system 302 may include a base power converter 336 (e.g., the base power converter 236 of FIG. 2) operationally connected to a base power transfer element 304 (e.g., the base power transfer element 204 of FIG. 2). Further, the base charging system 302 may include a base charging system controller 342 operationally connected to the base power converter 336 and to various ancillary systems such as a base communication system 372 operationally connected to a base communication antenna 373, a base positioning system 362 operationally connected to base positioning antennas 363, a base protection system 382 operationally connected to base protection sensors 383, and a base alignment system 352 operationally connected to a base alignment mechanism 353. One or more of the base alignment system 352, the base protection system 382, the base positioning system 362, and the base communication system 372 may be optional or may use one or more components of one or more of the systems 352, 362, 372, 382 (e.g., the base communication system 372 may provide communication via the base power transfer element 304 through modulation of the magnetic field used for power transfer).

Analogously, the electric vehicle charging system 314 may include an electric vehicle power converter 338 (e.g., the electric vehicle power converter 238 of FIG. 2) operationally connected to an electric vehicle power transfer element 316 (e.g., the electric vehicle element 216 of FIG. 2). Further, the electric vehicle charging system 314 may include an electric vehicle charging system controller 344 operationally connected to the electric vehicle power converter 338 and to various ancillary systems such as an electric vehicle communications system 374 operationally connected to an electric vehicle communication antenna 375, an electric vehicle positioning system 363 operationally connected to electric vehicle positioning antennas 365, an electric vehicle protection system 384 operationally connected to electric vehicle protection sensors 385, and an electric vehicle alignment system 354 operationally connected to an electric vehicle alignment mechanism 355. One or more of the electric vehicle alignment system 354, the electric vehicle protection system 384, the electric vehicle positioning system 364, and the electric vehicle communication system 374 may be optional or may use one or more components of one or more of the systems 354, 364, 374, 384 (e.g., the electric vehicle communication system 374 may receive communications via the electric vehicle power transfer element 304 through detection of modulation of the magnetic field used for power transfer). Any of the systems shown may be provided on one side but not the other (e.g., the electric vehicle protection system 384 may be absent while the base protection system 382 may be present and vice versa).

FIG. 3 also illustrates a wireless power link 305, a communication link 376, and a positioning link 366. Furthermore, FIG. 3 illustrates a base charging system power interface 337 and an electric vehicle charging system power interface 339 as well as a base charging system communication interface 343 and an electric vehicle charging system communication interface 345.

As described above with reference to FIG. 2, and assuming energy flow towards the electric vehicle 112, in FIG. 3 the base charging system power interface 337 may be configured to provide power to the base power converter 336 from a power source, such as an AC or DC power supply, e.g. the local power distribution center 130 as shown in FIG. 1. The base power converter 336 may receive AC or DC power via the base charging system power interface 337 to excite the base power transfer element 304. The electric vehicle power transfer element 316, when in the near-field coupling-mode region, may receive energy in the form of an oscillating signal. The electric vehicle power converter 338 converts the oscillating signal from the electric vehicle power transfer element 316 to a power signal suitable for charging the battery 118 via the electric vehicle charging system power interface 339.

In some implementations, the base wireless charging system 302 and all its subsystems and modules are centrally controlled by the base charging system controller 342 that handles and relays control and status information exchanged between the different subsystems. The base charging system controller 342 may include the base charging system communication interface 343 for communication with other systems (not shown) such as, for example, a computer, and a control center, or a smart power grid communications network. Analogously, the electric vehicle wireless charging system 314 may be centrally controlled by the electric vehicle charging system controller 344 that may include the electric vehicle charging system communication interface 345 for communication with other systems (not shown) such as, for example, a computer on board the vehicle 112, a battery management system that manages charge and discharge of the battery 118, other electronic systems within the vehicle 112, and remote electronic systems. The electric vehicle charging system controller 344 may communicate via the electric vehicle charging system communication interface 345 with a park assistance system by providing position data determined in the electric vehicle positioning system 364 and/or the base positioning system 362. In some implementations, the electric vehicle charging system controller 344 may communicate with a semi-automatic parking system configured to perform an automatic braking when the vehicle 112 has reached the final position for charging. In other implementations, the electric vehicle charging system controller 344 may communicate with an autonomous driving system configured to perform a largely automated parking that may provide higher parking accuracy, thus reducing or eliminating the need for mechanical alignment in any of the base wireless charging system 302 and the electric vehicle wireless charging system 314. Further, the electric vehicle charging system controller 344 may be configured to communicate with other electric vehicle onboard electronics. For example, electric vehicle charging system controller 344 may be configured to communicate with visual output devices (e.g., a dashboard display), acoustic/audio output devices (e.g., a buzzer, speakers) e.g., for purposes of guidance and alignment. The electric vehicle charging system controller 344 may be configured to receive commands from mechanical input devices (e.g., a keyboard, a touch screen, and pointing devices such as a joystick, a trackball, etc.), and from audio input devices (e.g., microphones of an electronic voice recognition system).

The base communication system 372 and the electric vehicle communication system 374 may include subsystems or circuits for specific application with separate communication channels. These communications channels may be separate physical channels or separate logical channels. In some implementations, communications are performed over the communication link 376 at radio frequencies (RF) using an RF communications standard such as Bluetooth®, Zigbee®, Dedicated Short Range Communications (DSRC), WLAN, etc. operating in an unlicensed band. In some other implementations, a cellular radio network is used. As non-limiting examples, the base alignment system 352 may communicate with the electric vehicle alignment system 354 through the communication link 376 to provide a feedback mechanism for more closely aligning the base power transfer element 304 with the electric vehicle power transfer element 316 via mechanical (kinematic) alignment. Similarly, the base positioning system 362 may communicate with the electric vehicle positioning system 364 through the communication link 376 to provide a feedback mechanism to guide an operator to a charging spot and to align the base power transfer element 304 with the electric vehicle power transfer element 316. In addition, there may be separate general-purpose communication links (e.g., channels) supported by the base communication system 372 and the electric vehicle communication system 374 for communicating other information between the base wireless charging system 302 and the electric vehicle wireless charging system 314 e.g., using an Ethernet over radio protocol. This information may include information about electric vehicle characteristics, battery characteristics and charging status, power capabilities and other characteristics of both the base wireless charging system 302 and the electric vehicle wireless charging system 314, as well as maintenance and diagnostic data for the electric vehicle 112. Some implementations may provide sufficient bandwidth for the allocation of value-add services to the vehicle user/owner.

In some implementations, the base positioning system 362 and/or the electric vehicle positioning system 364 are configured to determine the position of the electric vehicle 112 with respect to the charging spot by transmitting suitable signals via the positioning link 366. The positioning link 366 may be bi-directional, meaning that positioning signals may be emitted by the base positioning system 362 or the electric vehicle positioning system 364 or by both.

In some implementations relying on mechanical (kinematic) alignment by physically (mechanically) moving the base power transfer element 304 and/or the electric vehicle power transfer element 316, the base alignment system 352 and/or the electric vehicle alignment system controls the alignment of the base power transfer element 304 and/or the electric vehicle power transfer element 316 via the alignment mechanism 353 and/or the alignment mechanism 355, respectively. In some implementations, information on an alignment offset between the base power transfer element 304 and the electric vehicle power transfer element 316 is provided to the base alignment system 352 and/or to the electric vehicle alignment system 354 by the base positioning system 362 and/or the electric vehicle positioning system 364. In other implementations, information on an alignment offset is determined by the base alignment system 352 and/or by the electric vehicle alignment system 354.

Furthermore, the wireless charging system 300 may include detection and/or sensor systems to protect the wireless charging system 300. For example, the wireless charging system 300 may include the base protection system 382 and the electric vehicle protection system 384. These protection systems 382 and 384 may be configured to detect foreign objects in the space near and/or between the base power transfer element 304 and/or the electric vehicle power transfer element 316. As non-limiting examples, this may include detection of foreign (e.g., metallic) objects that may be heated up (e.g., through induction heating and/or hysteresis losses) (e.g., to critical temperatures) during the wireless charging operation, detection of hazardous events such as may be produced by metallic objects in connection with incandescent materials, and/or temperature monitoring of the base power transfer element 304 and/or the electric vehicle power transfer element 316 and/or of any other part of the wireless charging system 300 and the electric vehicle 112. Further, the protection systems 382 and 384 may be configured to detect living objects approaching the power transfer elements 304 and 316 beyond a radius. In some implementations, the protection systems 382 and 384 may be configured to detect objects based on mechanical alignment of the power transfer elements 304 and/or 316 e.g., mechanical alignment may be sensed as differing from an expected height and/or position based on a foreign object obstructing movement of a power transfer element.

The wireless charging system 300 may support plug-in charging via a wired connection. A wired charge port may integrate the outputs of the two different chargers prior to transferring power to or from the electric vehicle 112. Switching circuits may provide the functionality as needed to support both wireless charging and charging via a wired charge port.

To communicate between a base wireless charging system 302 and an electric vehicle wireless charging system 314, the wireless charging system 300 may use in-band signaling and/or out-of-band signaling. Out-of-band signaling may be performed via the communications link 376 e.g., using a RF technology as previously described. For in-band signaling, a low-depth amplitude or phase modulation of the wireless power carrier signal that may be transmitted on the wireless power link 305 may be used.

To enable wireless high power transfer, some implementations may be configured to transfer power at a frequency, as one example, in the range from 20-150 kHz. This low operating frequency may allow higher efficiency power conversion that may be achieved using solid state devices. In addition, there may be less coexistence issues with radio systems compared to other bands. However, other frequencies of operation in other ranges may also be used (e.g., frequencies in the 6.78 MHz or 13.56 MHz ISM bands).

The various operations of methods described above may be performed by any suitable means capable of performing the operations, such as various hardware and/or software component(s), circuits, and/or module(s). Generally, any operations illustrated in the figures may be performed by corresponding functional means capable of performing the operations.

The wireless charging system 300 may be configured to determine values of components and/or characteristics of the wireless charging system 300. For example, the system 300 may be configured to determine parasitic values of components and/or or values of components that are affected by interaction with other components, such as inductances that are affected by proximity to other components of the system 300. The values of the determined components may be used to adjust power transfer characteristics, e.g., frequency of a magnetic field used to transfer power wirelessly.

Figure 4:
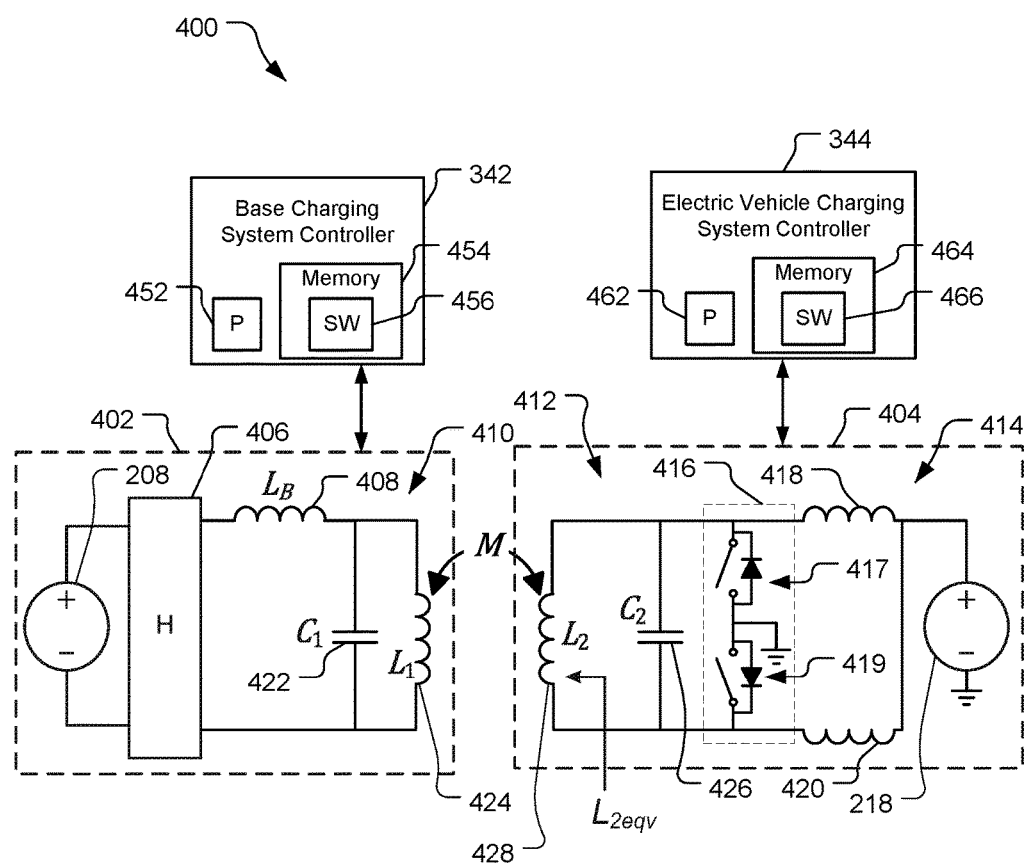
FIG. 4 is a schematic diagram of circuit of a wireless electric vehicle charging system shown in FIG. 2, comprising wireless charging system power transmission circuitry and wireless charging system power reception circuitry.
Figures 5, 6:
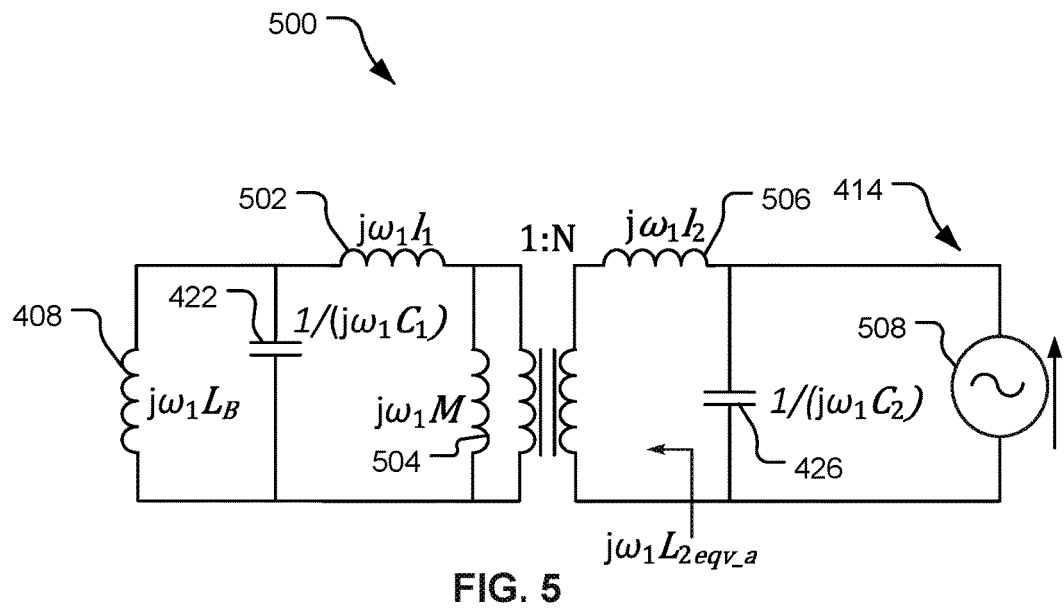
FIG. 5 is a schematic diagram of an equivalent circuit with the circuit shown in FIG. 4 on one state.
FIG. 6 is an equation of an impedance of the equivalent circuit shown in FIG. 5.
Figures 7, 8:
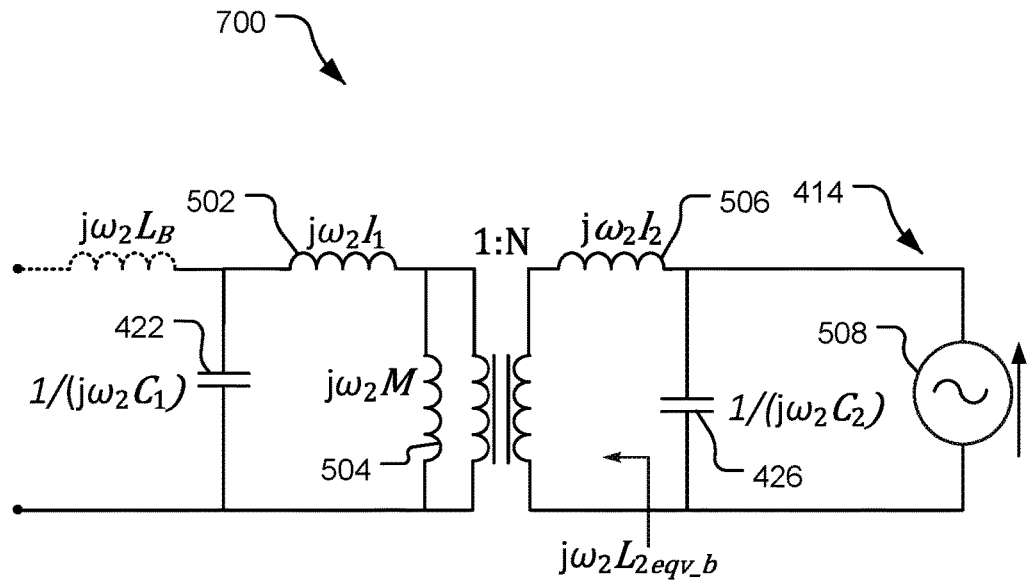
FIG. 7 is a schematic diagram of an equivalent circuit with the circuit shown in FIG. 4 in another state, different from the state corresponding to the equivalent circuit shown in FIG. 5.
FIG. 8 is an equation of an impedance of the equivalent circuit shown in FIG. 7.
Figures 9, 10:
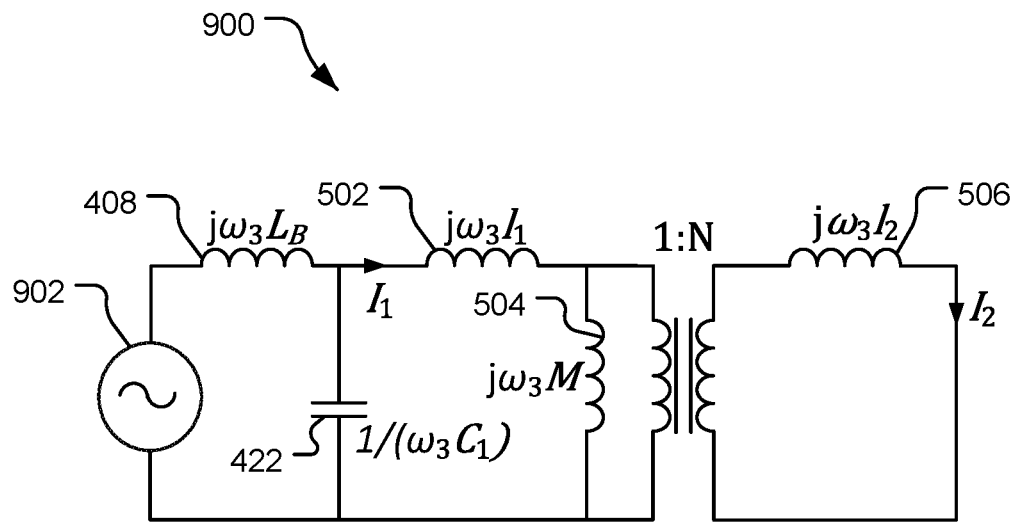
FIG. 9 is a schematic diagram of an equivalent circuit with a base wireless power transfer portion of the circuit shown in FIG. 4 providing power.
FIG. 10 is an equation relating leakage inductances and mutual coupling of the equivalent circuit shown in FIG. 9.

Referring to FIG. 4, with further reference to FIGS. 1-3, a circuit 400 that is a subset of components of a variation of the wireless charging system 200 shown in FIG. 2 includes a base wireless power transfer portion 402, a mobile wireless power transfer portion 404. While here the circuit 400 is part of an electric vehicle charging system, one or more of the components, e.g., the mobile wireless power transfer portion 404, could be part of a different system such as a mobile power transfer system not in a vehicle. The base wireless power transfer portion 402 is configured to provide power wirelessly to the mobile wireless power transfer portion 404, e.g., to charge a battery and/or to power a motor and/or to serve another purpose. The mobile wireless power transfer portion 404 is also configured to provide an evaluation signal wirelessly to the base wireless power transfer portion 402, here in the form of a magnetic field to which the base wireless power transfer portion 402 may couple. The controllers 342, 344 are configured to control (e.g., actuate/ deactuate, switch ON/OFF) various components (e.g., switches) of the base charging system 302 and the electric vehicle charging system 314 to implement the circuit 400. The controllers 342, 344 are communicatively coupled to the base wireless power transfer portion 402 and the mobile wireless power transfer portion 404, respectively. The controller 344 may be configured, for example, to cause the mobile wireless power transfer portion 404 to produce and emit the evaluation signal (e.g., cause the mobile wireless power transfer portion 404 to generate a field for coupling power to the base wireless power transfer portion 402). The controllers 342, 344 are further configured to communicate with each other through the communication systems 372, 374 and the antennas 373, 375 and to implement other circuits and/or configurations of components, e.g., as shown in FIGS. 5, 7, and 9.

The controllers 342, 344 may include appropriate hardware and, optionally, software to perform functions discussed herein. The controllers 342, 344 may include processors 452, 462 each of which is an intelligent hardware device, for example a central processing unit (CPU) such as those made or designed by QUALCOMM®, ARM®, Intel® Corporation, or AMD®, a microcontroller, an application specific integrated circuit (ASIC), etc. Either or both of the processors 452, 462 may comprise multiple separate physical entities that can be distributed in the systems 302, 314, respectively. Each of the controllers 342, 344 may include a memory 454, 464 that may include random access memory (RAM) and/or read-only memory (ROM). Each the memories 454, 464 is a non-transitory, processor-readable storage medium that stores software 456, 466 which is processor-readable, processor-executable software code containing instructions that are configured to, when performed, cause the respective processor 452, 462 to perform various functions described herein. The description may refer only to the controller 342 and/or the controller 344 performing functions, and this includes the processor 452 and/or the processor 462 performing the functions. The description may refer to only the processor 452 and/or the processor 462 performing functions, but this includes other implementations such as where one or more of the processors 452, 462 executes software and/or firmware. The software 456, 466 may not be directly executable by the processor 452, 462 and instead may be configured to, for example when compiled and executed, cause the processor 452, 462 to perform the functions. Whether needing compiling or not, the software 456, 466 contains the instructions to cause the processor 452, 462 to perform the functions.

Returning to FIG. 4, still with further reference to FIGS. 1-3, the circuit 400 includes the power supply 208, an H-bridge 406, a bridge inductor 408, a base transmit circuit 410, an electric vehicle receive circuit 412, and a signal generator 414. The H-bridge 406, which is an example of the base power converter 236, is an inverter, is communicatively coupled to the controller 342, and can change states in response to one or more control signals from the controller 342. That is, the controller 342 may be configured to cause the H-bridge 406 to change states, and the controller 344 may be configured to cause the controller 342 to cause the H-bridge 406 to change states, e.g., such that the controller 344 control a state of the circuit 400. For example, the H-bridge may be open circuited such that the power supply 208 is electrically isolated from the bridge inductor 408 and the base transmit circuit 410 such that current induced in the power transmit circuit 410 will not flow through the bridge inductor 408. As another example, the H-bridge 406 may be short circuited such that the bridge inductor 408 is in parallel with the base transmit circuit 410. The bridge inductor 408 has an inductance $L_B$. The signal generator 414 comprises components used to convert power received from the base wireless power transfer portion 402 to DC power and regulate the converted power provided to the load 218. Thus, the signal generator 414 can produce the evaluation signal without requiring components not already included in the wireless charging system 100 for charging the electric vehicle 112. That is, the evaluation signal may be produced without using any dedicated components, i.e., components used only for producing the evaluation signal.

The base transmit circuit 410 and the electric vehicle receive circuit 412 are variations of the base transmit circuit 206 and the electric vehicle receive circuit 222, respectively. The base transmit circuit 410 is a variation of the base transmit circuit 206 in that the base transmit circuit 410 includes a capacitor 422 (with a capacitance $C_1$) in parallel with a power-coupling element 424, shown as an inductor because the power-coupling element 424 may be a coil that is configured to produce a magnetic field and that has an inductance $L_1$. The electric vehicle receive circuit 412 is a variation of the electric vehicle receive circuit 222 in that the electric vehicle receive circuit 412 includes a capacitor 426 (with a capacitance $C_2$) in parallel with a power-coupling element 428, shown as an inductor because the power-coupling element 428 may be a coil that is configured to produce a magnetic field and that has an inductance $L_2$. A mutual coupling M between the power-coupling elements 424, 428 may change as a physical relationship (e.g., distance, amount of overlap) of the power-coupling elements 424, 428 relative to each other changes. The power-coupling elements 424, 428 are examples of the power transfer elements 204, 304, 216, 316 in that the power-coupling elements 424, 428 are configured to transfer power by producing, and coupling to, magnetic fields.

The signal generator 414 is configured to provide a evaluation signal to the electric vehicle receive circuit 412 that the power-coupling element 428 may transmit such that the electric vehicle receive circuit 412 acts as a transmit circuit to transmit the evaluation signal and the base transmit circuit 410 acts as a receive circuit to receive the evaluation signal. The signal generator 414 includes a signal-providing structure 416, inductors 418, 420, and the load 218 (here a battery). The signal generator 414, including the signal-providing structure 416, is communicatively coupled to the controller 344. The controller 344 is configured to control the signal-providing structure 416 (e.g., by opening/closing switches 417, 419) to cause the signal-providing structure 416 to act as a rectifier and switching circuitry to generate a suitable DC power output to provide a charging signal (from a signal received from the power transfer portion 402) to the load 218, e.g., a battery. The controller 344 is configured to cause, e.g., by closing/opening switches (not shown) as appropriate, the signal generator 414 to provide (and thus the power-coupling element 428 to emit) the evaluation signal. Here, the signal-providing structure 416 combined with the inductors 418, 420 and the vehicle receive circuit 412 is a self-resonant structure that will automatically adjust a frequency of a signal provided by the signal-providing structure 416 to a resonant frequency of the electric vehicle receive circuit 412. Thus, the same circuitry for receiving a charging signal and providing charge to a battery may be used to produce and emit the evaluation signal. The controller 344 is configured to monitor and determine the frequency of the evaluation signal, e.g., by monitoring ON/OFF cycles of switches of the signal-providing structure 416. Alternatively, the signal-providing structure 416 could be configured to provide a signal with a frequency in accordance with a control signal provided to the signal-providing structure 416 by the controller 344. In this configuration, the controller 344 may be configured to sweep the frequency of the evaluation signal across a range of frequencies. The controller 344 may be configured to monitor a voltage across the power-coupling element 428, determine a frequency of the evaluation signal at which the voltage across the power-coupling element peaks, and identify this frequency as the resonant frequency of the electric vehicle receive circuit 412. Thus, the controller 344 and the signal-providing structure 416 may provide means for determining a resonant frequency of the mobile wireless power transfer portion 404, including means for causing a evaluation signal to be emitted by the power-coupling element 428. The signal generator 414, when providing the evaluation signal, may be considered to be a current source.

Referring to FIG. 5, with further reference to FIGS. 1-4, an equivalent circuit 500 represents the circuit 400 in a state with the H-bridge 406 short circuited. The equivalent circuit 500 includes the bridge inductor 408, the capacitor 422, a base leakage inductor 502, a coupling inductor 504, a vehicle leakage inductor 506, the capacitor 426, and a current source 508. The base leakage inductor 502 represents the leakage inductance of the power-coupling element 424, and has an inductance $l_1$. The coupling inductor 504 represents a mutual inductance of the power-coupling element 424 and the power-coupling element 428 and has an inductance M. The vehicle leakage inductor 506 represents the leakage inductance of the power-coupling element 428, and has an inductance $l_2$. The leakage inductance $l_1$ combined with (added to) the mutual inductance M is a self-inductance of the power-coupling element 424 and the leakage inductance $l_2$ combined with the mutual inductance M is a self-inductance of the power-coupling element 428. The current source 508 represents the signal generator 414 when providing the evaluation signal. The controller 342 is configured to control the H-bridge 406 to cause the H-bridge 406 to be short circuited. The controllers 342, 344 are configured to communicate with each other through the base communication system 372 and the electric vehicle communication system 374 to coordinate the state of the circuit 400, e.g., the status of the H-bridge 406 and whether the evaluation signal is being provided. For example, the controller 344 may instruct the controller 342 to short or open circuit the H-bridge 406 and the controller 342 may inform the controller 344 of the status of the H-bridge 406, e.g., short circuited, open circuited, or neither (e.g., normal operation).

Referring also to FIG. 6, with the circuit 400 in a state corresponding to the equivalent circuit 500, an equivalent impedance $\omega_1 L_{2eqv\_a}$ of the base wireless power transfer system 202 as seen by the electric vehicle wireless power transfer system 214 is provided by an equation 600. In the equation 600, $L_B$ is the inductance of the bridge inductor 408, N is a turn ratio between the power-coupling element 424 and the power-coupling element 428, and $C_1$ is the capacitance of the capacitor 422 (the capacitor 426 has a capacitance $C_2$ but this capacitance is not part of the equation 600). The values of $L_B$ and $C_1$ are known system design parameters. These values may be stored, for example, by the controller 344. Further in the equation 600, $\omega_1$ is the resonant frequency of the electric vehicle receive circuit 412 with the H-bridge 406 short circuited. The controller 344 may be configured to determine a value of the equivalent impedance $\omega_1 L_{2eqv\_a}$ by measuring a voltage across, and a current through, the power-coupling element 428, and dividing this voltage by this current. Also or alternatively, the controller 344 may be configured to determine the value of the equivalent impedance $\omega_1 L_{2eqv\_a}$ by measuring the resonant frequency $\omega_1$ and determining $1/(\omega_1 C_2)$ as this is equal to the value of the equivalent impedance $\omega_1 L_{2eqv\_a}$ at resonance. When the controller 344 (or the controller 342) is described as measuring a quantity, e.g., current or voltage, this refers to the controller 344 communicating with a sensor that measures the respective quantity and provides an indication of the respective quantity to the controller 344.

Referring to FIG. 7, with further reference to FIGS. 1-5, an equivalent circuit 700 represents the circuit 400 in a state with the H-bridge 406 open circuited. The resonant state of the equivalent circuit 700 is different than the resonant state of the equivalent circuit 500. Thus, changing between the H-bridge 406 being open circuited and short circuited changes the resonant state of the circuit 400. The equivalent circuit 700 excludes the bridge inductor 408 (from a current path of the equivalent circuit 700) but includes the capacitor 422, the base leakage inductor 502, the coupling inductor 504, the vehicle leakage inductor 506, the capacitor 426, and the current source 508. The controller 342 is configured to control the H-bridge 406 to cause the H-bridge 406 to be open circuited, e.g., as requested or instructed by the controller 344. Thus, the controller 342 (and possibly the controller 344) provide means for causing the combination of the base wireless power transfer portion 402 and the mobile wireless power transfer portion 404 to change between states having different component configurations.

Referring also to FIG. 8, with the circuit 400 in a state corresponding to the equivalent circuit 700, an equivalent impedance $\omega_2 L_{2eqv\_b}$ of the base wireless power transfer system 202 as seen by the electric vehicle wireless power transfer system 214 is provided by an equation 800. In the equation 800, as with the equation 600, $C_1$ is the capacitance of the capacitor 422 and N is the turn ratio between the power-coupling element 424 and the power-coupling element 428. Further in the equation 600, $\omega_2$ is the resonant frequency of the electric vehicle receive circuit 412 with the H-bridge 406 open circuited. The controller 344 may be configured to determine a value of the equivalent impedance $\omega_2 L_{2eqv\_b}$ by measuring a voltage across, and a current through, the power-coupling element 428, and dividing this voltage by this current. Also or alternatively, the controller 344 may be configured to determine the value of the equivalent impedance $\omega_2 L_{2eqv\_b}$ by measuring the resonant frequency $\omega_2$ and determining $1/(\omega_2 C_2)$ as this is equal to the value of the equivalent impedance $\omega_2 L_{2eqv\_b}$ at resonance.

The different resonant states of the circuit 400 as shown by the equivalent circuits 500, 700 are examples, and other configurations may be used to provide for different resonant states of the circuit 400. For example, a capacitor could be selectively used or not used in the base wireless power transfer portion 402 and/or a capacitor could be selectively used or not used in the mobile wireless power transfer portion 404. As another example, one or more capacitors may be disposed in parallel, with each capacitor disposed in series with a switch (e.g., a relay or a transistor forming an AC switch), and the switches selectively closed/open to include/exclude the respective capacitor from the circuit. As with the discussion above, an equivalent impedance could be determined for each resonant state as used to determine values of parameters of the circuit 400 as discussed more below. Using the H-bridge 406 as discussed above, the different resonant states may be implemented without providing components specifically for producing the different resonant states (e.g., components not used for operation of the circuit 400 to power (e.g., charge or operate) a load, or to detect coupling between the power-coupling elements 424, 428).

Referring to FIG. 9, with further reference to FIGS. 1-4, an equivalent circuit 900 represents the circuit 400 in a state with the base wireless power transfer portion 402 providing power to the mobile wireless power transfer portion 404. The equivalent circuit includes a voltage source 902, e.g., comprising a combination of the power supply 208 and the H-bridge 406. As shown, the equivalent circuit 900 excludes the capacitor 426 and the signal generator 414 shown in FIG. 4. To exclude the capacitor 426 and the signal generator 414, the controller 344 may be configured to isolate the capacitor 426 and the signal generator 414 from the power-coupling element 428. For example, the controller 344 may be configured to open a switch (not shown) that is disposed between the signal generator 414 and the vehicle load 218 to electrically isolate the signal generator 414 from the vehicle load 218. The controller 344 may also or alternatively be configured to close a switch (e.g., using the signal-providing structure 416 or a relay) to short circuit the power-coupling element 428 to electrically isolate the signal generator 414 from the power-coupling element 428. In the equivalent circuit 900, $\omega_3$ is the operating frequency of the base transmit circuit 410, which may be the resonant frequency of the base transmit circuit 410, but may not be relevant, e.g., $\omega_3$ is absent from the equation shown in FIG. 10 discussed below. The equivalent circuit 900 is for a "coupling check" during which less than charging power is provided by the base wireless power transfer system 202 to the electric vehicle wireless power transfer system 214 in order to determine whether the power-coupling elements 424, 428 are sufficiently coupled to justify charging power being provided. Charging power refers to a sufficient power amount to charge or operate the vehicle load 218, e.g., to charge a battery. At least one of the controllers 342, 344 is configured to provide the other controller with an indication of a respective current $I_1$, $I_2$ in a respective one of the power-coupling elements 424, 428. For example, the controller 344 may measure the current $I_2$ and send, via the communication system 374, an indication of this current to the controller 342. The controller 342 may use this information to determine whether the power-coupling elements 424, 428 are sufficiently coupled for the controller 342 to cause the base wireless power transfer system 202 to provide charging power. For example, the controller 342 may determine whether a coupling factor (e.g., $I_2/I_1$ exceeds a threshold value such as 0.2. The controller 342 may consider one or more other factors in addition to the coupling factor in determining whether to cause the base wireless power transfer system 202 to provide charging power, e.g., to help ensure that power is not provided undesirably, e.g., to living objects or other objects that may be injured or damaged by receipt of the charging power.

Referring also to FIG. 10, with the circuit 400 in a state corresponding to the equivalent circuit 900, an equation 1000 represents a ratio of the unknown values of the leakage inductance $l_2$ of the power-coupling element 428 and the mutual inductance M in terms of known or measurable quantities. In the equation 1000, as with the equations 600 and 800, N is the turns ratio between the power-coupling element 424 and the power-coupling element 428. The controller 344 is configured to determine a value of the current $I_2$ by measuring the current flowing through the power-coupling element 428. The controller 344 is configured to determine a value of the current $I_1$ by receiving (e.g., in response to a request from the controller 344) from the controller 342 an indication of the current flowing through the power-coupling element 424 as measured by the controller 342. Similar equations may be used to determine a leakage inductance for the equivalent circuit 500 shown in FIG. 5 or the equivalent circuit shown in FIG. 7. For example, the leakage inductance $l_1$ in the equivalent circuit 700 may be represented by the following equation $$l_1 = M\left(\frac{Nl_2}{l_1} - 1\right) + \frac{1}{\omega_2^2 C_1} \tag{1}$$

Referring to FIGS. 1-10, the controller 344 may be configured to determine one or more magnetic characteristics, e.g., of the circuit 400. For example, the controller 344 may be configured to determine the leakage inductances $l_1$, $l_2$, and the mutual inductance M. The controller 344 may be configured to use the known values of N, $L_B$, $C_1$, and $C_2$ (e.g., stored in memory of the controller 344 and/or stored in memory of the controller 342 and transmitted to the controller 344), and the measured and/or determined values of $\omega_1$, $\omega_2$, $\omega_1 L_{2eqv\_a}$, $\omega_2 L_{2eqv\_b}$, $I_1$, and $I_2$ (e.g., the ratio $I_2/I_1$) to determine values of the leakage inductances $l_1$, $l_2$, and the mutual inductance M. Having accessed stored values of, and/or having measured, and/or having determined values of N, $L_B$, $C_1$, $C_2$ $\omega_1$, $\omega_2$, $\omega_1 L_{2eqv\_a}$, $\omega_2 L_{2eqv\_b}$, and the ratio $I_2/I_1$ (i.e., "known" parameters), the three equations 600, 800, and 1000 have a combined total of three unknowns, i.e., the leakage inductances $l_1$, $l_2$, and the mutual inductance M. One or more of the equations 600, 800, 1000 can be rewritten for a respective unknown in terms of only known/measured/determined parameters. For example, an equation for the leakage inductance $l_2$ can be determined by rearranging and substituting using the equations 600, 800, 1000 to yield the following equation (that uses the quadratic equation)

$$l_2 = \frac{-\beta \pm \sqrt{\beta^2 - 4\alpha\gamma}}{2\alpha} \text{ where} \tag{2}$$

$$\alpha = AL_{2eqv\_a} - L_{2eqv\_a} - AL_{2eqv\_b} + L_{2eqv\_b} - BA^2 \tag{3}$$

$$\beta = BA(L_{2eqv\_a} + L_{2eqv\_b}) \tag{4}$$

$$\gamma = -BL_{2eqv\_a}L_{2eqv\_b} \quad (5)$$

$$A = N^2\left(\frac{I_2}{NI_1 - N^2I_2}\right) + 1 \quad (6)$$

$$B = \frac{X_{B1} - X_{B2}}{\left(\frac{I_2}{NI_1 - N^2I_2}\right)} \quad (7)$$

$$X_{B1} = \frac{1}{\frac{1}{L_B} - \omega_1^2 C_1} \quad (8)$$

$$X_{B2} = \frac{-1}{\omega_2^2 C_1} \quad (9)$$

The controller 344 may be configured to obtain (access from memory, measure, determine) and use values of the known parameters and to determine (e.g., solve for) the values of the leakage inductances $l_1$, $l_2$, and the mutual inductance M using the appropriate equation(s). For example, the controller 344 may use equations (2)-(9) to determine the leakage inductance $l_2$, then equation 1000 to determine the mutual inductance M, and then the equation 600 or the equation 800 to determine the leakage inductance $l_1$. Also or alternatively, the controller 342 could be configured to solve for the values of the leakage inductances $l_1$, $l_2$, and the mutual inductance M using these equations, e.g., after obtaining appropriate information (e.g., values of $\omega_1$, $\omega_2$, $\omega_1 L_{1eqv\_a}$, $\omega_2 L_{2eqv\_b}$, and the ratio $I_2/I_1$) from the controller 344, e.g., via the communication systems 372, 374. The controller 344 thus provides means for determining one or more magnetic characteristics of the base wireless power transfer portion 402 and the mobile wireless power transfer portion 404, with the magnetic characteristic(s) including leakage inductances, mutual inductance, and/or or one or more further characteristics as discussed below.

Figure 11:
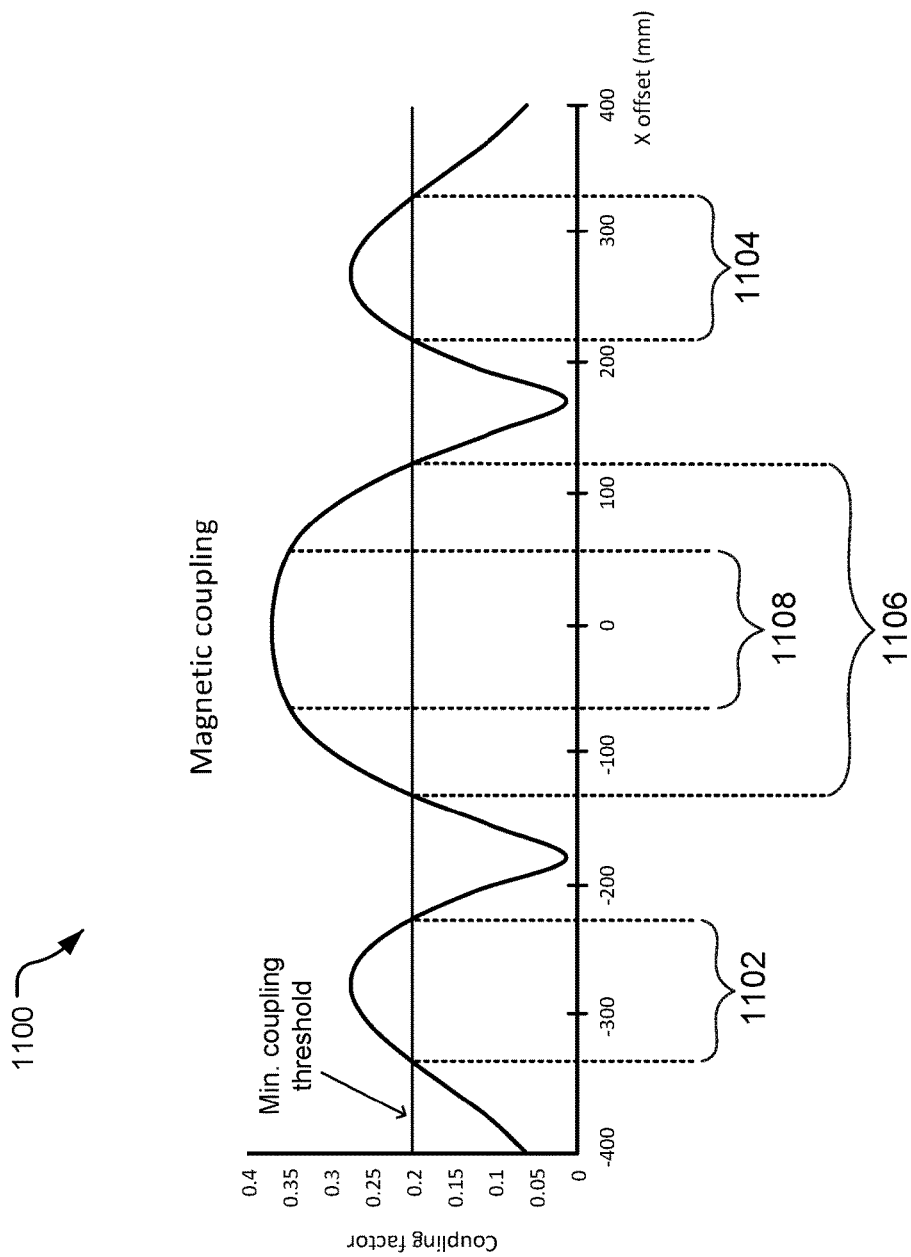
FIG. 11 is a graph of coupling factor as a function of forward/backward offset of power-coupling elements shown in FIG. 4.

The controller 344 may be configured to use the determined values of the leakage inductances $l_1$, $l_2$, and the mutual inductance M for one or more of a variety of purposes. For example, referring also to FIG. 11, an example of a graph 1100 of coupling factor between the power-coupling elements 424, 428 as a function of x offset (drive-direction offset, see FIG. 1 for x-direction) has multiple sections 1102, 1104, 1106 where the coupling factor is above a coupling threshold of the coupling factor, here a coupling factor of 0.2. Further, within the range 1106 is a narrower range, a desired charging range 1108 (also called a tolerance range), The controller 344 may be configured to analyze parameters in addition to the coupling factor in order to determine whether the base wireless power transfer portion 402 should provide charging power. For example, the controller 344 may be configured to determine whether a self-inductance is acceptable and that the coupling factor is acceptable. The self-inductance may be determined to be acceptable if the self-inductance is within an acceptable range or above a self-inductance threshold value, e.g., below which the power-coupling element 428 is known to be outside of the charging zone. The self-inductance threshold may be specific to the design of the electric vehicle wireless power transfer system 214. The coupling factor may be determined to be acceptable if, for example, the coupling factor is in an acceptable range such as being above the coupling threshold, indicating that the power-coupling element 428 will receive an acceptable amount of the power transmitted by the power-coupling element 424, e.g., that the power transfer will be acceptably efficient. Thus, the controller 344 may be configured to determine the self-inductance of the power-coupling element 428 with the coupling factor above the coupling threshold, e.g., corresponding to the sections 1102, 1104, 1106. The controller 344 may be configured to authorize (e.g., instruct) the base wireless power transfer portion 402 to provide charging power in response to determining that the coupling factor is above the coupling threshold and that the self-inductance is acceptable.

As another example, the controller 344 may be configured to use the determined values of the leakage inductances $l_1$, $l_2$, and the mutual inductance M to determine a three-dimensional offset of the power coupling element 428 relative to the power-coupling element 424. For example, the controller 344 (and/or the controller 342) may store a look-up table of empirical data for the leakage inductances $l_1$, $l_2$, and the mutual inductance M for corresponding x-, y-, and z-offsets of the power coupling element 428 relative to the power-coupling element 424. The controller 344 may determine the values of the leakage inductances $l_1$, $l_2$, and the mutual inductance M and find a matching (or similar) set of inductance values in the look-up table, with an offset set of x-, y-, and z-offsets corresponding to the set of inductance values being the x-, y-, and z-offsets of the power coupling element 428 relative to the power-coupling element 424.

Figure 12:
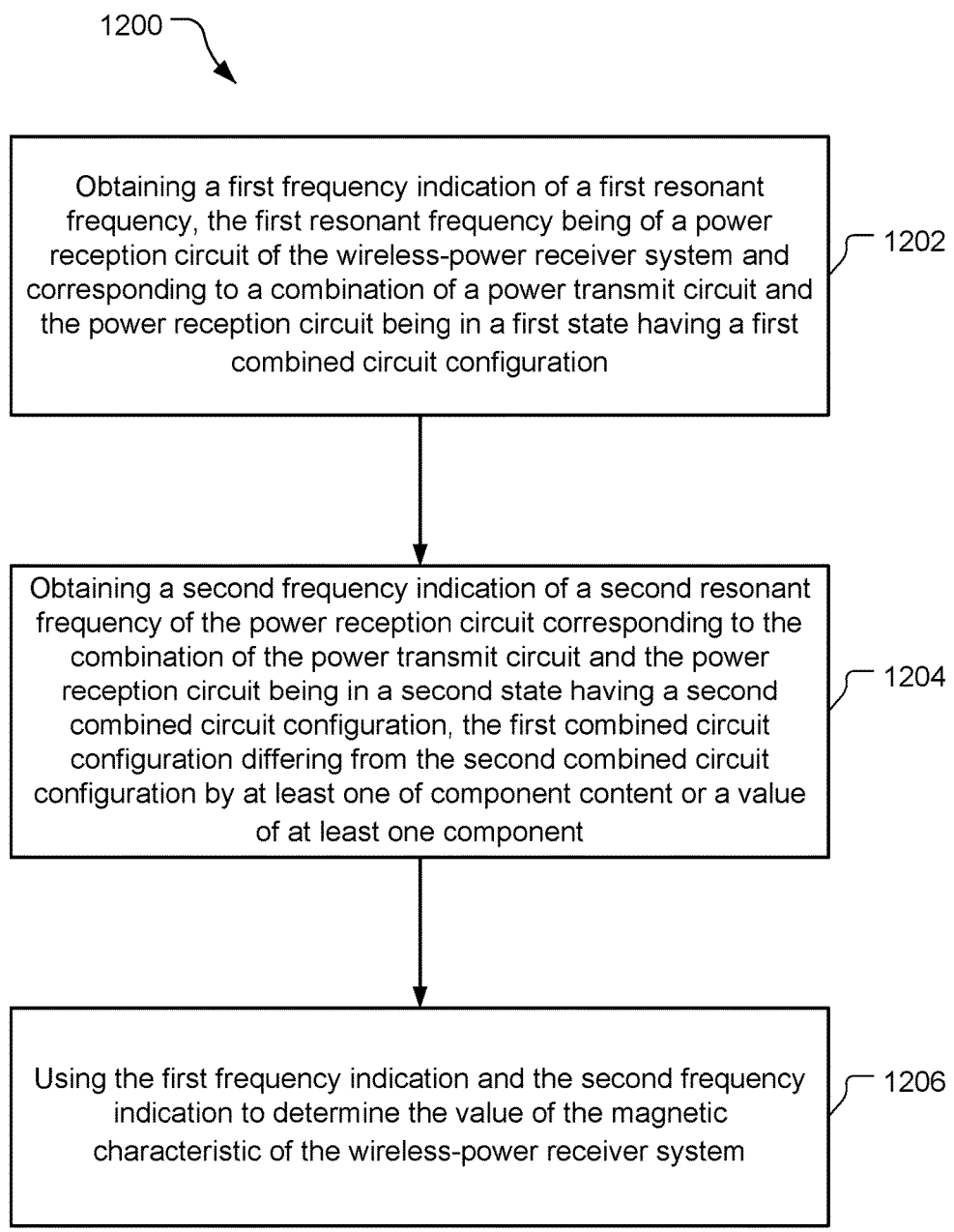
FIG. 12 is a block flow diagram of a method of determining a value of a magnetic characteristic of a wireless-power receiver system.

Referring to FIG. 12, with further reference to FIGS. 1-11, a method 1200 of determining a value of a magnetic characteristic of a wireless-power receiver system includes the stages shown. The method 1200 is, however, an example only and not limiting. The method 1200 may be altered, e.g., by having stages added, removed, rearranged, combined, performed concurrently, and/or having single stages split into multiple stages.

At stage 1202, the method 1200 includes obtaining a first frequency indication of a first resonant frequency, the first resonant frequency being of a power reception circuit of the wireless-power receiver system and corresponding to a combination of a power transmit circuit and the power reception circuit being in a first state having a first combined circuit configuration. The power reception circuit is a portion of the wireless-power receiving system and the configuration is a combination of the power transmit circuit and the power reception circuit being in a first state having a first combined circuit configuration. That is, with the power transmit circuit and the power reception circuit being in the first state, the power transmit circuit and the power reception circuit have a first combined circuit configuration. For example, the controller 344 may obtain the resonant frequency of the mobile wireless power transfer portion 404, e.g., by monitoring a frequency of a self-resonant circuit or monitoring current in the power-coupling element 428 for different evaluation signal frequencies as discussed above. Also or alternatively, the controller 342 may obtain the first frequency indication, e.g., from the controller 344 via the communication systems 372, 374.

At stage 1204, the method 1200 includes obtaining a second frequency indication of a second resonant frequency of the power reception circuit corresponding to the combination of the power transmit circuit and the power reception circuit being in a second state having a second combined circuit configuration, the first combined circuit configuration differing from the second combined circuit configuration by at least one of component content or a value of at least one component. The different configuration is a combination of the power transmit circuit and the power reception circuit being in a second state having a second combined circuit configuration. That is, with the power transmit circuit and the power reception circuit being in the second state, the power transmit circuit and the power reception circuit have a second combined circuit configuration, and the second combined circuit configuration is different than the first combined circuit configuration. The different configurations may be different in component content and/or value of a component (or values of components). The terms "first state" and "second state" do not imply or require a particular order of occurrence of the states. As an example of different configurations of combinations of the power transmit circuit and the power reception circuit, the combination of the systems 402, 404 with the H-bridge 406 short circuited may be the first state, and with the H-bridge 406 open circuited may be the second state (or vice versa). The controller 344 may determine the second frequency indication in any appropriate manner, such as those discussed above with respect to stage 1204. Also or alternatively, the controller 342 may obtain the second frequency indication, e.g., from the controller 344 via the communication systems 372, 374.

At stage 1206, the method 1200 includes using the first frequency indication and the second frequency indication to determine the value of the magnetic characteristic of the wireless-power receiver system. For example, the controller 344 and/or the controller 342 may use the frequency indications to determine one or more self-inductances of the system 400 and/or a mutual inductance of the system 400.

The method 1200 may include one or more further stages. For example, the method 1200 may include emitting an evaluation signal from a power-coupling element of the power reception circuit, with the first and second resonant frequencies are resonant frequencies of the evaluation signal. An example of emitting the evaluation signal includes causing a self-resonant structure of the power reception circuit to provide the evaluation signal to the power-coupling element. In this case, as an example, to obtain the first resonant frequency or the second resonant frequency, the controller 344 may monitor the signal-providing structure 416, providing the evaluation signal, for a frequency of a self-resonant circuit. Another example of emitting the evaluation signal includes causing a signal generator to induce the current in the receive coil with a plurality of different frequencies. In this case, as an example, to obtain the first resonant frequency or the second resonant frequency, the controller 344 may cause the signal-providing structure 416 to provide multiple different frequencies of the evaluation signal (e.g., to sweep the frequency across a range of frequencies) and identify the resonant frequency as the one that corresponds to a highest level of current through the power-coupling element 428.

Further to emitting the evaluation signal, the method 1200 may include causing the power transmit circuit to change a content of a component set that receives energy from the evaluation signal between the first state and the second state. For example, this may include causing an inverter bridge to change between being open circuited and shorted between the first state and the second state. For example, the controller 342 (alone or in conjunction with the controller 344) may cause the H-bridge 406 to change from being short circuited to being open circuited or vice versa. The controller 342 may send a control signal to the H-bridge 406 to cause the appropriate change.

Also or alternatively, the method 1200 may include one or more further stages. For example, determining the value of the magnetic characteristic may include: determining a first leakage inductance of a transmit coil of the power transmit circuit; determining a second leakage inductance of a receive coil of the power reception circuit; and determining a mutual inductance between the transmit coil and the receive coil. The method 1200 may further include: obtaining a first current indication of current in the transmit coil; obtaining a second current indication of current in the receive coil; obtaining a first impedance indication of an impedance of the power reception circuit with the combination of the power transmit circuit and the power reception circuit in the first state; obtaining a second impedance indication of the impedance of the power reception circuit with the combination of the power transmit circuit and the power reception circuit in the second state; and using the first frequency indication, the second frequency indication, the first impedance indication, the second impedance indication, the first current indication, and the second current indication to determine the first leakage inductance, the second leakage inductance, and the mutual inductance. For example, the controller 344 and/or the controller 342 may use the equations 600, 800, 1000, having obtained values for all the parameters in these equations except for the leakage inductances $l_1$, $l_2$ and the mutual inductance M to derive values for these parameters, from which the controller 344 may calculate one or more other values such as self-inductance of the power-coupling element 428.

Other Considerations

Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, "or" as used in a list of items prefaced by "at least one of" or prefaced by "one or more of" indicates a disjunctive list such that, for example, a list of "at least one of A, B, or C," or a list of "one or more of A, B, or C" means A or B or C or AB or AC or BC or ABC (i.e., A and B and C), or combinations with more than one feature (e.g., AA, AAB, ABBC, etc.).

The term "exemplary" indicates that something is an example and does not imply that the thing (e.g., a feature or embodiment) is better than or preferred over another thing. Thus, an "exemplary embodiment" may not be the best known embodiment, and may not be preferred over another embodiment, but the exemplary embodiment is an example of an embodiment that may be used.

Further, an indication that information is sent or transmitted, or a statement of sending or transmitting information, "to" an entity does not require completion of the communication. Such indications or statements include situations where the information is conveyed from a sending entity but does not reach an intended recipient of the information. The intended recipient, even if not actually receiving the information, may still be referred to as a receiving entity, e.g., a receiving execution environment. Further, an entity that is configured to send or transmit information "to" an intended recipient is not required to be configured to complete the delivery of the information to the intended recipient. For example, the entity may provide the information, with an indication of the intended recipient, to another entity that is capable of forwarding the information along with an indication of the intended recipient.

Substantial variations may be made in accordance with specific requirements. For example, customized hardware might also be used. Further, connection to other computing devices such as network input/output devices may be employed.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional stages or functions not included in the figure.

Components, functional or otherwise, shown in the figures and/or discussed herein as being coupled, connected, or communicating with each other are operably coupled. That is, they may be directly or indirectly, wired or wirelessly, connected to enable signal flow between them.

A statement that a value exceeds (or is more than or above) a first threshold value is equivalent to a statement that the value meets or exceeds a second threshold value that is slightly greater than the first threshold value, e.g., the second threshold value being one value higher than the first threshold value in the resolution of a computing system. A statement that a value is less than (or is within or below) a first threshold value is equivalent to a statement that the value is less than or equal to a second threshold value that is slightly lower than the first threshold value, e.g., the second threshold value being one value lower than the first threshold value in the resolution of a computing system.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

Further, more than one invention may be disclosed.

The invention claimed is:

1. A wireless-power receiver system comprising:
   a power reception circuit coupled to an electrical load and configured to receive power wirelessly from a power transmit circuit to power the electrical load;
   a memory; and
   a processor, communicatively coupled to the memory and to the power reception circuit, configured to:
      obtain a first frequency indication of a first resonant frequency of the power reception circuit corresponding to a combination of the power transmit circuit and the power reception circuit being in a first state having a first combined circuit configuration;
      obtain a second frequency indication of a second resonant frequency of the power reception circuit corresponding to the combination of the power transmit circuit and the power reception circuit being in a second state having a second combined circuit configuration, the first combined circuit configuration differing from the second combined circuit configuration by at least one of component content or a value of at least one component; and
      determine a value of a magnetic characteristic of the wireless-power receiver system using the first frequency indication and the second frequency indication.

2. The system of claim 1, wherein the processor is further configured to cause an evaluation signal to be emitted by a power-coupling element, of the power reception circuit, that is configured to receive the power from the power transmit circuit, and wherein the processor is configured to obtain each of the first frequency indication and the second frequency indication by determining a frequency of the evaluation signal.

3. The system of claim 2, wherein the power reception circuit comprises a self-resonant structure, and wherein the processor is communicatively coupled to the self-resonant structure and configured to cause the self-resonant structure to produce the evaluation signal.

4. The system of claim 2, wherein the power reception circuit comprises a signal generator, and wherein the processor is communicatively coupled to the signal generator and configured to cause the signal generator to produce the evaluation signal with a plurality of different frequencies.

5. The system of claim 1, wherein the processor is further configured to cause the combination of the power transmit circuit and the power reception circuit to change between the first state and the second state.

6. The system of claim 1, wherein to determine the value of the magnetic characteristic of the wireless-power receiver system the processor is configured to:
   determine a first leakage inductance of a transmit coil of the power transmit circuit;
   determine a second leakage inductance of a receive coil of the power reception circuit; and
   determine a mutual inductance between the transmit coil and the receive coil.

7. The system of claim 6, wherein the processor is configured to:
   obtain a first current indication of current in the transmit coil, and a second current indication of current in the receive coil;
   obtain a first impedance indication of an impedance of the power reception circuit with the combination of the power transmit circuit and the power reception circuit in the first state, and a second impedance indication of the impedance of the power reception circuit with the combination of the power transmit circuit and the power reception circuit in the second state; and
   use the first frequency indication, the second frequency indication, the first impedance indication, the second impedance indication, the first current indication, and the second current indication to determine the first leakage inductance, the second leakage inductance, and the mutual inductance.

8. The system of claim 1, wherein the power reception circuit comprises a resonant structure including a capacitance and an inductance.

9. The system of claim 1, wherein the power reception circuit comprises a self-resonant structure comprising a plurality of switches coupled between a power-coupling element of the power reception circuit and the electrical load.

10. The system of claim 1, wherein the processor is further configured to send the first frequency indication and the second frequency indication to the power transmit circuit via the power reception circuit.

11. A method of determining a value of a magnetic characteristic of a wireless-power receiver system, the method comprising:
obtaining a first frequency indication of a first resonant frequency, the first resonant frequency being of a power reception circuit of the wireless-power receiver system and corresponding to a combination of a power transmit circuit and the power reception circuit being in a first state having a first combined circuit configuration;
obtaining a second frequency indication of a second resonant frequency of the power reception circuit corresponding to the combination of the power transmit circuit and the power reception circuit being in a second state having a second combined circuit configuration, the first combined circuit configuration differing from the second combined circuit configuration by at least one of component content or a value of at least one component; and
using the first frequency indication and the second frequency indication to determine the value of the magnetic characteristic of the wireless-power receiver system.

12. The method of claim 11, further comprising emitting an evaluation signal from a power-coupling element of the power reception circuit, wherein obtaining each of the first frequency indication and the second frequency indication comprises determining a frequency of the evaluation signal.

13. The method of claim 12, further comprising causing the power transmit circuit to change a content of a component set that receives energy from the evaluation signal between the first state and the second state.

14. The method of claim 13, wherein causing the power transmit circuit to change the content of the component set comprises causing an inverter bridge to change between being open circuited and shorted between the first state and the second state.

15. The method of claim 12, wherein emitting the evaluation signal comprises causing a self-resonant structure of the power reception circuit to provide the evaluation signal to the power-coupling element.

16. The method of claim 12, wherein emitting the evaluation signal comprises causing a signal generator to induce current in the receive coil with a plurality of different frequencies.

17. The method of claim 11, wherein determining the value of the magnetic characteristic of the wireless-power receiver system comprises:
determining a first leakage inductance of a transmit coil of the power transmit circuit;
determining a second leakage inductance of a receive coil of the power reception circuit; and
determining a mutual inductance between the transmit coil and the receive coil.

18. The method of claim 17, further comprising:
obtaining a first current indication of current in the transmit coil;
obtaining a second current indication of current in the receive coil;
obtaining a first impedance indication of an impedance of the power reception circuit with the combination of the power transmit circuit and the power reception circuit in the first state;
obtaining a second impedance indication of the impedance of the power reception circuit with the combination of the power transmit circuit and the power reception circuit in the second state; and
using the first frequency indication, the second frequency indication, the first impedance indication, the second impedance indication, the first current indication, and the second current indication to determine the first leakage inductance, the second leakage inductance, and the mutual inductance.

19. The method of claim 11, wherein obtaining the first frequency indication and the second frequency indication comprise receiving the first frequency indication and the second frequency indication at a power transmit circuit from a power reception circuit of a wireless-power receiver system.

20. A wireless-power receiver system comprising:
an electrical load;
power reception means for receiving power wirelessly from a power transmit circuit and for providing power to the electrical load;
first determining means, communicatively coupled to the power reception means, for determining:
a first frequency indication of a first resonant frequency of the power reception means corresponding to a combination of the power transmit circuit and the power reception means being in a first state having a first combined circuit configuration; and
a second frequency indication of a second resonant frequency of the power reception means corresponding to the combination of the power transmit circuit and the power reception means being in a second state having a second combined circuit configuration, the first combined circuit configuration differing from the second combined circuit configuration by at least one of component content or a value of at least one component; and
second determining means, communicatively coupled to the first determining means, for determining a value of a magnetic characteristic of the wireless-power receiver system using the first frequency indication and the second frequency indication.

21. The system of claim 20, wherein the first determining means are for causing an evaluation signal to be emitted by a power-coupling element, of the power reception means, that is configured to receive the power from the power transmit circuit, and wherein the first determining means are configured to determine each of the first frequency indication and the second frequency indication by determining a frequency of the evaluation signal.

22. The system of claim 21, wherein the power reception means comprise a self-resonant structure, and wherein the first determining means are for causing the self-resonant structure to produce the evaluation signal.

23. The system of claim 21, wherein the first determining means are for causing the power reception means to produce the evaluation signal with a plurality of different frequencies.

24. The system of claim 20, wherein the first determining means comprise means for causing the combination of the power transmit circuit and the power reception means to change between the first state and the second state.

25. The system of claim 20, wherein the second determining means are for determining:
a first leakage inductance of a transmit coil of the power transmit circuit;
a second leakage inductance of a receive coil of the power reception means; and
a mutual inductance between the transmit coil and the receive coil.

26. The system of claim 25, wherein:
the first determining means are further for determining:
a first current indication of current in the transmit coil;
a second current indication of current in the receive coil;
a first impedance indication of an impedance of the power reception means with the combination of the power transmit circuit and the power reception means in the first state; and
a second impedance indication of the impedance of the power reception means with the combination of the power transmit circuit and the power reception means in the second state; and
the second determining means are for using the first frequency, the second frequency, the first impedance indication, the second impedance indication, the first current indication, and the second current indication to determine the first leakage inductance, the second leakage inductance, and the mutual inductance.

27. The system of claim 20, further comprising means for sending the first frequency indication and the second frequency indication to the power transmit circuit.

28. A wireless-power transmitter system comprising:
a power transmit circuit configured to transmit power wirelessly to a wireless-power receiver system;
a memory; and
a processor, communicatively coupled to the memory and to the power transmit circuit, configured to:
obtain a first frequency indication of a first resonant frequency of a power reception circuit of the wireless-power receiver system, the first resonant frequency corresponding to a combination of the power transmit circuit and the power reception circuit being in a first state having a first combined circuit configuration;
obtain a second frequency indication of a second resonant frequency of the power reception circuit corresponding to the combination of the power transmit circuit and the power reception circuit being in a second state having a second combined circuit configuration, the first combined circuit configuration differing from the second combined circuit configuration by at least one of component content or a value of at least one component; and
determine a value of a magnetic characteristic of the wireless-power receiver system using the first frequency indication and the second frequency indication.

29. The system of claim 28, wherein to determine the value of the magnetic characteristic of the wireless-power receiver system the processor is configured to:
determine a first leakage inductance of a transmit coil of the power transmit circuit;
determine a second leakage inductance of a receive coil of the power reception circuit; and
determine a mutual inductance between the transmit coil and the receive coil.

30. The system of claim 29, wherein the processor is configured to:
obtain a first current indication of current in the transmit coil, and a second current indication of current in the receive coil;
obtain a first impedance indication of an impedance of the power reception circuit with the combination of the power transmit circuit and the power reception circuit in the first state, and a second impedance indication of the impedance of the power reception circuit with the combination of the power transmit circuit and the power reception circuit in the second state; and
use the first frequency indication, the second frequency indication, the first impedance indication, the second impedance indication, the first current indication, and the second current indication to determine the first leakage inductance, the second leakage inductance, and the mutual inductance.

* * * * *